(12) United States Patent
Suzuki et al.

(10) Patent No.: US 6,629,224 B1
(45) Date of Patent: *Sep. 30, 2003

(54) METHOD FOR OPERATING A SEMICONDUCTOR MEMORY DEVICE HAVING A PLURALITY OF OPERATING MODES FOR CONTROLLING AN INTERNAL CIRCUIT

(75) Inventors: Takaaki Suzuki, Kawasaki-shi (JP); Toshiya Uchida, Kawasaki-shi (JP); Kotoku Sato, Kawasaki-shi (JP); Yoshimasa Yagishita, Kawasaki-shi (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/562,739

(22) Filed: May 1, 2000

(30) Foreign Application Priority Data

May 7, 1999 (JP) ............................................ 11-126716
Mar. 17, 2000 (JP) ..................................... P 2000-076045

(51) Int. Cl.$^7$ ............................................... G06F 12/00
(52) U.S. Cl. ..................................... 711/167; 711/111
(58) Field of Search ................................. 711/104, 167, 711/111

(56) References Cited

U.S. PATENT DOCUMENTS

| 5,053,990 | A |   | 10/1991 | Kreifels et al. | 711/103 |
| 5,749,086 | A |   | 5/1998 | Ryan | 711/105 |
| 5,973,991 | A | * | 10/1999 | Tsuchida et al. | 365/233 |
| 6,166,990 | A | * | 12/2000 | Ooishi et al. | 365/194 |
| 6,195,306 | B1 | * | 2/2001 | Horiguchi et al. | 365/226 |
| 6,400,643 | B1 | * | 6/2002 | Setogawa | 365/189.07 |
| 6,442,088 | B1 | * | 8/2002 | Tsuchida et al. | 365/203 |
| 6,480,423 | B2 | * | 11/2002 | Toda et al. | 365/189.01 |
| 6,496,430 | B2 | * | 12/2002 | Aikawa et al. | 365/200 |
| 2001/0001262 | A1 | * | 5/2001 | Horiguchi et al. | 365/226 |
| 2001/0008281 | A1 | * | 7/2001 | Niimi et al. | 257/1 |
| 2001/0008497 | A1 | * | 7/2001 | Horiguchi et al. | 365/226 |

* cited by examiner

*Primary Examiner*—Reba I. Elmore
(74) *Attorney, Agent, or Firm*—Arent Fox Kintner Plotkin & Kahn

(57) ABSTRACT

Signals supplied to predetermined terminals are accepted as commands at a plurality of times, the number of operating modes is sequentially narrowed down based on the command each time and an internal circuit is controlled according to the narrowed operating modes. Since the information necessary for determining an operating mode is accepted at a plurality of times, the number of terminals necessary for inputting commands can be reduced. In particular, in case of inputting commands at a dedicated terminal, its input pads, input circuits, or the like are no longer be required so that the chip size can be reduced. The reduction is accomplished by reducing the number of terminals, which gives limits to the package size. The command controlling circuit with a plurality of accepting circuits is comprised. Each of the accepting circuits respectively accepts signals, supplied at a plurality of times, each time. In other words, in accordance with the timing of the signal supplement, a different accepting circuit is respectively operated and the internal circuit is controlled. Accordingly, a command controlling circuit may be readily designed even in the semiconductor memory device having a complicated command combination. Consequently, it is able to facilitate the verification of the design.

26 Claims, 24 Drawing Sheets

METHOD FOR OPERATING A SEMICONDUCTOR MEMORY DEVICE HAVING A PLURALITY OF OPERATING MODES FOR CONTROLLING AN INTERNAL CIRCUIT

BACKGROUND OF THE INVENTION

1. Field of the Invention

The present invention relates to a method for operating a semiconductor memory device having a plurality of operating modes and a semiconductor memory device having a plurality of operating modes.

2. Description of the Related Art

Conventionally, semiconductor memory devices such as DRAMs receive a different address signal from the same address terminal at twice in order to reduce the number of terminals. Such a semiconductor memory device receiving multiplexed address signals can be molded in a small package in spite of its large memory capacity.

A synchronous DRAM (SDRAM) is known as another semiconductor memory device to receive multiplexed address signals. The SDRAM is a memory device that operates input/output interfacing circuits at high speed in synchronization with a clock signal and write and read data at high speed.

The SDRAM is capable of performing read and write operations in a plurality of memory cells connected with a same word line, at high speed. However, in memory cells connected with different word lines, the word lines must be selected at a timing similar to that in the prior art DRAMs. Therefore, an access time in a random access is equivalent to that in the DRAMs.

An operating mode of SDRAMs is determined upon inputting a command once; then, the SDRAMs perform the operating mode determined. Due to this, a number of terminals for receiving multiple command signals such as a chip select signal (/CS), row address strobe signal (/RAS), column address strobe signal (/CAS), write enable signal (/WE), and clock enable signal (CKE) are required. In addition, as the sequence of inputting commands is not predetermined, a timing of performing a precharge operation of a bit line can not be generated inside of a chip. Accordingly, precharging a bit line needs to be performed by supplying a command from the exterior of the chip.

In recent years, fast cycle RAM (FCRAM) have been developed as DRAMs whose operation cycle is significantly shortened to perform data read/write operation at high speed during random accessing.

The FCRAM is designed so that its internal operation is divided into three stages. An operation in each stage is completed automatically. This makes it possible to perform a pipeline processing not only for data input/output units but also for an address accepting an operation and an operation of a memory core unit. The use of such pipeline processing makes it possible to shorten the operating cycle. Additionally, as the FCRAM is designed to achieve shortening an access time as a top priority, address terminals are non-multiplexed and all address signals are supplied at the same time of inputting a command. Upon inputting a single command, an operating mode is determined and then the predetermined operating mode is performed.

The above-described SDRAMs have a disadvantage that these require a great number of command input terminals. An increase in number of command input terminals complicates a configuration of circuit, which controls a command input, on printed wiring boards.

The above-noted FCRAMs have a disadvantage that, when compared to DRAMs and SDRAMs having equal memory capacities, they require more terminals because of non-multiplexed addressing. An increase in terminal number results in increases in associative components such as address pads and address input circuits and others, which causes a problem that the chip size gets larger. Another disadvantage is that such increase in terminal number can cause the package size to likewise increase. In particular, in the case CSP (chip size package) which has been becoming a mainstream in the art, balls connected to a printed wiring board are laid out in the form of two-dimensional arrangement thereon. This may result in an increase in size of package depending upon the number of terminals.

SUMMARY OF THE INVENTION

An object of the present invention is to reduce the number of terminals necessary for inputting commands and addresses.

Another object of the present invention is to prevent an increase in chip size and its package size by reducing the number of terminals.

Still another object of the present invention is to retain an operation cycle at high speed even when terminals decrease in number.

Further object of the invention is to especially accept a signal at high speed in order to retain an operation cycle at high speed.

According to one of the aspects of the method for operating a semiconductor memory device in the present invention, signals supplied to predetermined terminals are accepted as commands at a plurality of times, the number of operating modes is sequentially narrowed down based on the command each time and an internal circuit is controlled according to the narrowed operating modes. Since the information necessary for determining an operating mode is accepted at a plurality of times, the number of terminals necessary for inputting commands can be reduced. In particular, in case of inputting commands at a dedicated terminal, its input pads, input circuits, or the like are no longer be required so that the chip size can be reduced. One example is that four or eight operating modes may be identified respectively when commands are accepted at two or three times at two terminals. The reduction is accomplished by reducing the number of terminals, which gives limits to the package size.

According to another aspect of the method for operating, a semiconductor memory device in the present invention, commands are accepted at twice. The number of operating modes are narrowed down by the first command. At this time, a part of the circuit necessary for performing a predetermined operating mode among the narrowed operating modes is operated. Then, an operating mode is determined by the second command; when the operating mode is a predetermined operating mode, the remainder of the circuit is operated. Performing a part of the predetermined operating mode in advance makes it possible to shorten the access time even in the case of accepting commands at twice.

According to still another aspect of the method for controlling a semiconductor memory device in the present invention, a mode register setting mode without accompanying any internal operation is such that the operation can be completed within a predetermined period even when an operation is initiated after the receipt of the second command. Similarly, a data retaining mode does not require inputting /outputting data from/to the exterior so that the operation may be completed within a predetermined period even when the operation is initiated after the receipt of the second command.

According to yet another aspect of the method for controlling a semiconductor memory device in the present invention, it is unnecessary to accept information for setting the mode register together with the first command from an address terminal. Therefore, it is unnecessary to retain the information until the second command is supplied; as a result, it is possible to prevent the complication of a controlling circuit.

According to further aspect of the method for operating a semiconductor memory device in the present invention, the control necessary for shifting to the data retaining mode is performed when an operating mode determined by the second command is a data retaining mode. Thereafter, the control necessary for shifting to a standby mode is performed when a signal supplied to a predetermined terminal is set at a predetermined level during the data retaining mode. By monitoring a signal at a predetermined terminal other than by a command, it is possible to shift to another operating mode during a predetermined operating mode.

According to further aspect of the method for operating a semiconductor memory device in the present invention, the control necessary for shifting to a self refresh mode is performed when a signal supplied to a predetermined terminal is set at a predetermined level during an auto refresh mode. A difference between the auto refresh and self refresh modes is that the former is given a refresh timing from the exterior whereas the latter generates such timing by, itself. An identical circuit is used for performing both a refresh counter operation and a refresh operation. Therefore, the auto refresh mode continuously and smoothly shifts to the self refresh mode, shortening the time required for the shifting.

According to further aspect of the method for operating a semiconductor memory device in the present invention, the acceptance of the first command is inhibited by a signal supplied to a predetermined terminal and the device becomes a standby state. When a signal supplied to another predetermined terminal reaches a predetermined level in the standby state, the control for shifting to the standby mode is performed. By monitoring a signal at a predetermined terminal while inhibiting the input of the first command, it is possible to shift to another operating mode other than by a command.

According to another aspect of the method for operating a semiconductor memory device in the present invention, when a signal supplied to a predetermined terminal reaches a predetermined level while the device is in the standby state, the control for shifting to a low power consumption mode is performed. In this low power consumption mode, the device is in a static state and is not directly related to an access operation. The control for shifting to the low power consumption mode is performed by supplying a predetermined signal to a terminal, which results in the improved usability.

According to further aspect of the method for operating a semiconductor memory device in the present invention, the first and second commands are accepted in synchronization with a clock signal. The second command is accepted a half or one clock after the acceptance of the first command. Accordingly, the information of the second command is obtainable in a short time after the acceptance of the first command. As a result, any delay in controlling the second command may be minimized when accepting commands at twice.

According to another aspect of the method for operating a semiconductor memory device in the present invention, a write operation mode and a read operation mode are distinguished by the first command. In other words, the operating modes narrowed down by the first command does not include both the write and read operation modes. After the acceptance of the first command, the circuit common to both the write and the read operation modes initiates the operation. Starting the operation of such circuit necessary for the write and read operation modes in advance makes it possible to shorten the access time.

According to still another aspect of the method for operating a semiconductor memory device in the present invention, a signal supplied to an address terminal by the first command is accepted as a part of an address necessary for a write or a read operation. When an operating mode determined by the second command is either the write or the read operation mode, a signal supplied to the address terminal is accepted as the remainder of the address required for the write or the read operation. Accepting the address necessary for the write or the read operation at twice results in significantly reducing the number, of address terminals. Consequently, the number of address pads, address input circuits or the like are decreased and the chip size can be reduced. The reduction is accomplished by reducing the number of terminals, which gives limits to the package size.

According to still another aspect of the method for operating a semiconductor memory device in the present invention, a word line is selected prior to the receipt of the second command to shorten the access time.

According to further aspect of the method for operating a semiconductor memory device in the present invention, when an operating mode determined by the second command is an auto refresh mode, a word line corresponding to the address accepted together with the first command, is unselected. Then, a word line corresponding to a refresh address internally generated, is selected. Memory cells are reliably refreshed by switching over the selection of a word line.

According to yet another aspect of the method for operating a semiconductor memory device in the present invention, at least a sub-word line is specified and selected according to an address accepted together with the first command. After the acceptance of the first command, it is possible to control the circuit required for operating predetermined memory cells prior to the receipt of the second command. Accordingly, the access time may be shortened.

According to yet another aspect of the method for operating a semiconductor memory device in the present invention, the activation of a column decoder is first initiated by the first command. When the operating mode determined by the second command is either a write operation mode or a read operation mode, an address accepted is used to select a column selecting line. The access time may be shortened since the column decoder is activated in advance before determining the address to select the column selecting line.

According to further aspect of the method for operating a semiconductor memory device in the present invention, a signal supplied to a predetermined terminal is accepted as information for specifying the length of write data when the operating mode determined by the second command is the write operation mode. The length of write data is directly controlled based on the information accepted. Accordingly, in case a plurality of data is accepted in succession from an input/output terminal(s) during the write operation, it is possible to change the length of data accepted under the simple control procedures. In addition, with regard to data unnecessary to be written (that is, a portion longer than the length of data specified), any write control is not required. This saves a time taken to control the write operation. Thus, it is possible to make an input timing of the first command earlier in the next cycle. The length of write data can be changed only by the control of the input/output circuits so that the control may be reliably performed by accepting information together with the second command.

According to further aspect of the method for operating a semiconductor memory device in the present invention, a signal supplied to a predetermined terminal is accepted as masking information which invalidates a part of write data supplied in succession when the operating mode determined by the second command is the write operation mode. A part of the write data is masked based on the masking information accepted. To control the masking information by a dedicated terminal, the information has to be accepted from the dedicated terminal at each time of performing the write operation and that makes the control procedure complicated. Accepting the masking information together with the second command makes it possible to easily control the masking of write data.

According to further aspect of the method for operating a semiconductor memory device in the present invention, a signal supplied to a predetermined terminal is accepted as information for specifying the length of read data when the operating mode determined by the second command is the read operation mode. The length of read data is directly controlled based on the information accepted. Accordingly, in case a plurality of data is accepted in succession from an input/output terminal(s) during the read operation, it is possible to change the length of data accepted under the simple control procedure. In addition, with regard to data unnecessary to read (that is, a portion longer than the length of data specified), any output control is not required. This saves a time taken to control the read operation. Thus, it is possible to make an input timing of the first command earlier in the next cycle. The length of read data can be changed only by the control of the input/output circuits so that the control may be reliably performed by accepting information along with the second command.

According to further aspect of the method for operating a semiconductor memory device in the present invention, a signal supplied to a predetermined terminal is accepted as masking information which invalidates a part of read data supplied in succession when the operating mode determined by the second command is the read operation mode. A part of the read data is masked based on the masking information accepted. To control the masking information by a dedicated terminal, the information has to be accepted from the dedicated terminal at each time of performing the write operation and this makes the control procedure complicated. Accepting the masking information together with the second command makes it possible to easily control the masking of write data.

According to a further aspect of the method for operating a semiconductor memory device in the present invention, in case that the operating modes corresponding to the first command include the write operation mode, the write data and the addresses accepted in the previous write operation mode are used to perform the write operation. This makes it possible to complete the write cycle early. In the case of performing a read operation after a write operation, it is possible to initiate the read operation early.

According to another aspect of the method for operating a semiconductor memory device in the present invention, in case that the operation modes narrowed down, upon the inputting of the first command, include a write operation mode, a part of the circuit necessary for performing a write operation is operated. When the operation mode determined by the inputting of the second command is an auto refresh mode, a refresh operation is carried out after the performance of the write operation. Thus, it is possible to effectively perform the write operation by utilizing the circuit which has initiated its operation by the inputting of the first command.

According to another aspect of the semiconductor memory device in the present invention, a command controlling circuit is comprised. The command controlling circuit accepts signals supplied to predetermined terminals as commands at a plurality of times, sequentially narrows down the number of operating modes based on the command each time and controls an internal circuit according to the narrowed operating mode. Since the information necessary for determining operating mode is accepted at a plurality of times, the number of terminals necessary for inputting commands can be reduced. In particular, in case of inputting commands at a dedicated terminal, its input pads, input circuits, or the like are no longer be necessary so that the chip size can be reduced. The reduction is accomplished by reducing the number of terminals, which gives limits to the package size. One example is that four or eight operating modes may be respectively identified when commands are accepted at two or three times at two terminals.

According to another aspect of the semiconductor memory device in the present invention, the command controlling circuit accepts commands at twice, narrows down a plurality of operating modes by the first command, and operates a part of the circuit necessary for performing a predetermined operating mode among the narrowed modes. The command controlling circuit determines an operating mode by the second command. When the operating mode is a predetermined operating mode, the remainder of the circuit is operated.

The number of terminals necessary for accepting commands can be reduced since the information necessary for determining an operating mode is accepted at a plurality of times. In particular, in case of inputting commands at a dedicated terminal, its input pads, input circuits, or the like are no longer be necessary so that the chip size can be reduced. The reduction is accomplished by reducing the number of terminals, which gives limits to the package size. Performing a part of the predetermined operating mode in advance makes it possible to shorten the access time even in the case of accepting commands at twice.

According to further aspect of the semiconductor memory device in the present invention, the command controlling circuit comprises a plurality of accepting circuits. Each of the accepting circuits respectively accepts signals, supplied at a plurality of times, each time. In other words, in accordance with the timing of the signal supplement, a different accepting circuit is respectively operated and the internal circuit is controlled. Accordingly, a command controlling circuit may be readily designed even in the semiconductor memory device which has a complicated command combination. Consequently, it is able to facilitate the verification of the design.

According to another aspect of the semiconductor memory device in the present invention, each of accepting circuits accepts signals in synchronization with the different edges of a clock signal. Due to directly accepting the signals by the same clock signal, the accepting procedure speeds up. This makes it possible to initiate an operation of the internal circuit early and shorten the access time.

According to still another aspect of the semiconductor memory device in the present invention, a timing generator, which generates a plurality of accepting signals based on a clock signal, is comprised. Each of accepting circuits respectively accepts signals in synchronization with the accepting signals. It is no longer necessary to wire the clock signal to the plurality of accepting circuits because the signals are accepted utilizing the accepting signals generated from the clock signal. As a result, even when signals supplied and the accepting circuits are substantial in number, the signals can be accepted without increasing the load of the clock signal.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DETAILED DESCRIPTION OF PREFERRED EMBODIMENTS

Some preferred embodiments of the present invention will now be explained in detail with reference to the accompanying drawings.

Figure 1:
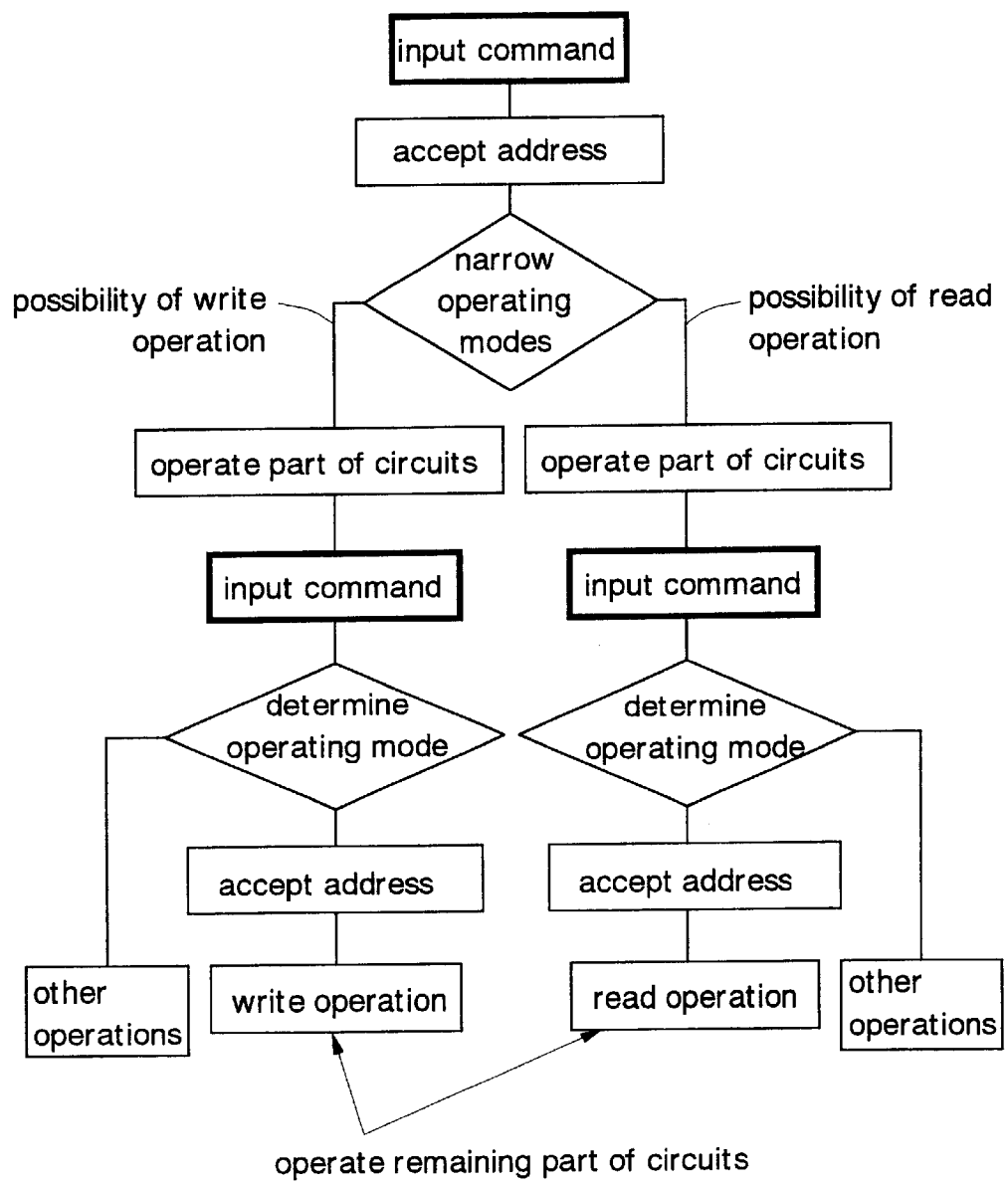
FIG. 1 is a flowchart showing the basic principle of the first embodiment in the method for operating the semiconductor memory device according to the present invention.

FIG. 1 is a flowchart showing the basic principle of the first embodiment in the method for operating the semiconductor memory device according to the present invention.

In this embodiment, first a command input and an address acceptance are performed and the number of operating modes is narrowed down. The term "narrowing down the number of operating modes " may refer, for example, to whether there is a possibility of a write operation mode or a read operation mode being performed. Thereafter, a part of circuits in the memory device is operated and the next command is inputted. An operating mode is determined by this command thus letting the remainder of the circuits begin to operate. When the operating mode determined is either the write operation or the read operation, addresses are accepted.

Figure 2:
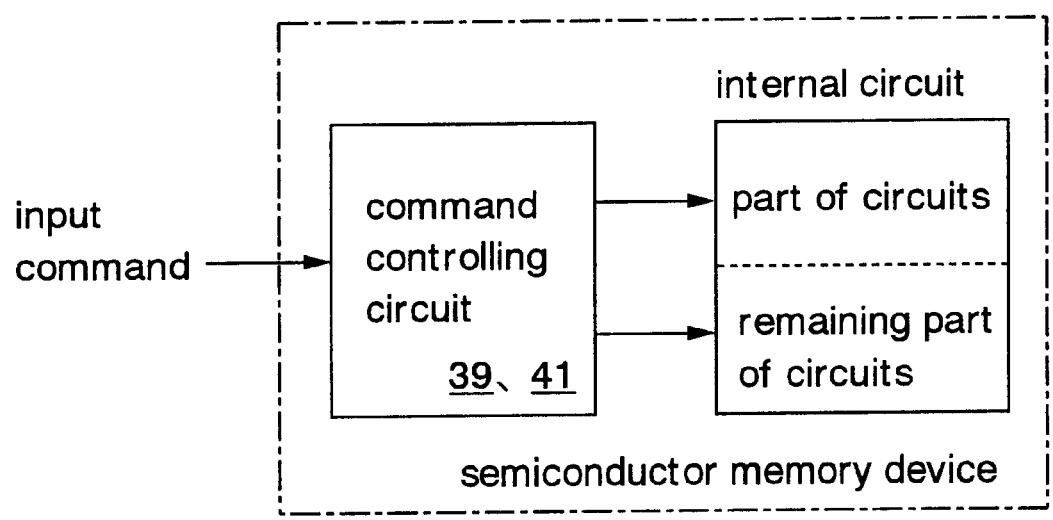
FIG. 2 is a block diagram showing the basic principles of the first embodiment of the semiconductor memory device according to the present invention.

FIG. 2 is a block diagram showing the basic principle of the first embodiment in the semiconductor memory device according to the present invention.

The semiconductor memory device comprises command controlling circuits 39, 41. The command controlling circuits 31, 41 accept signals supplied from a predetermined terminal as commands at a plurality of times and sequentially narrow down the number of operating modes based on the command at each time, control an internal circuit according to the narrowed operating mode. F For example, the command controlling circuits, 39, 41 accept signals supplied from the predetermined terminal as commands at twice. The command controlling circuits 39, 41 narrow down the number of operating modes at the time of inputting the first command and operate a part of circuits necessary for performing a predetermined operating mode among the narrowed operating modes. The command controlling circuits 39, 41 then determine an operating mode at the time of inputting the second command and operate the remainder of the circuits when the operating mode determined is the predetermined operating mode.

Figure 3:
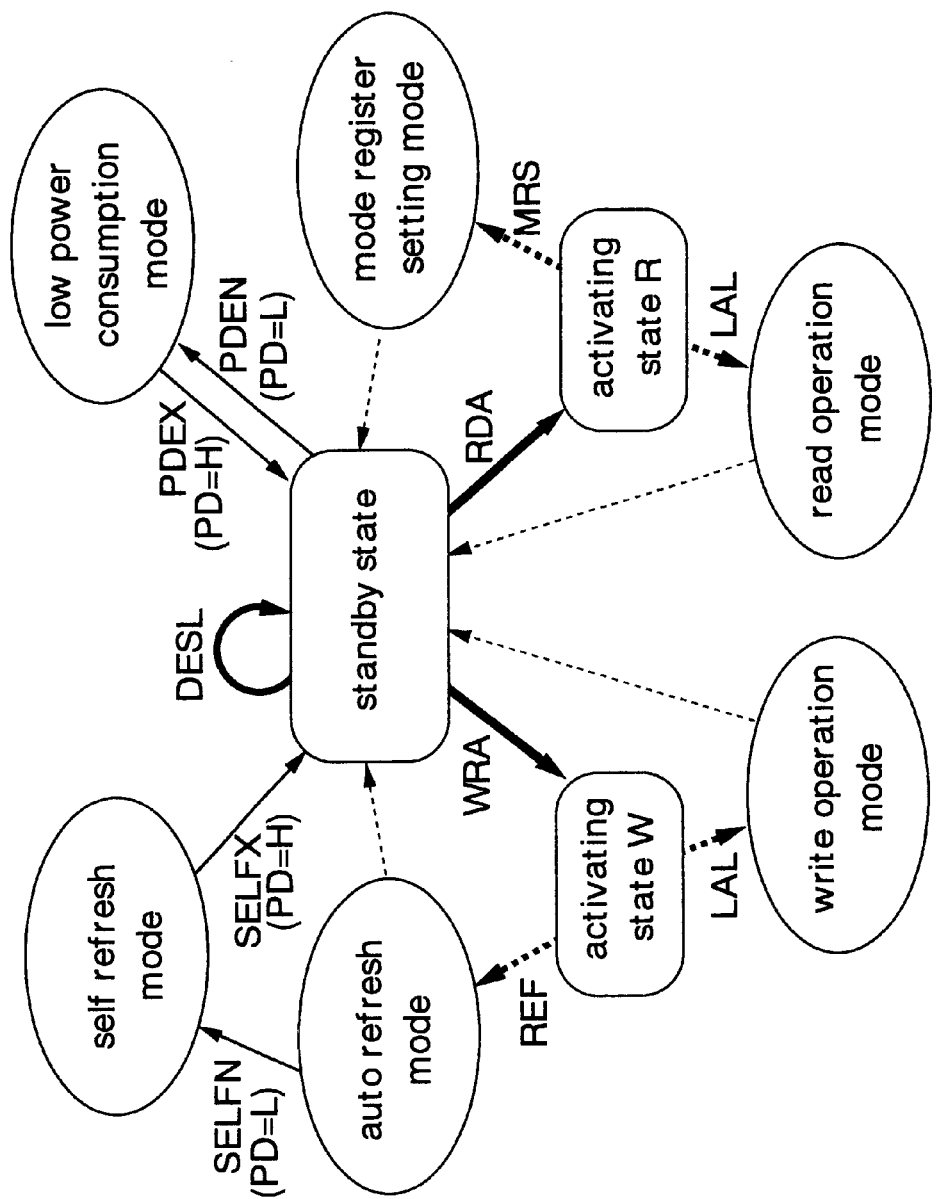
FIG. 3 is a state transition diagram showing an embodiment of the method for operating the semiconductor memory device and the semiconductor memory device according to the present invention.

FIG. 3 shows a state transition diagram in the first embodiments of the method for operating a semiconductor memory device and a semiconductor memory device according to the present invention.

The semiconductor memory device of this embodiment is formed as a dynamic random access memory (DRAM) with its internal circuit subdivided into three stages, which functions to let each of them perform a pipeline operation.

The DRAM has six different operating modes and three operating states. The operating modes are a low power consumption mode, a mode register setting mode, a read operation mode, a write operation mode, an auto refresh mode, and a self refresh mode. The operating states are a standby state, an activating state R, and an activating state W.

Each of the operating modes and operating states is put into another when receiving any one of an RDA command, a WRA command, a DESL command, a MRS command, a LAL command, a REF command, a SELFN command, a SELFX command, a PDEX command, and a PDEN command. Arrows are used to designate the directions.

The RDA command, the WRA command, the DESL command, the MRS command, the LAL command and the REF command are determinable by a chip select signal/CS and a function signal FN, as will be described later. The RDA command, the WRA command, and the DESL command, indicated by thick solid lines in the drawing, are referred to the first commands, which are acceptable in the standby state. The MRS command, the LAL command and the REF command, indicated by thick broken lines, are referred to the second commands, which are acceptable in the activating state R or the activating state W. In other words the second commands may be accepted after the first commands have been received. Accordingly, the shifting to the read operation mode, the write operation mode, the mode register setting mode, and the auto refresh mode are performed by receiving the second command after having received the first command. Additionally the activating state R is a state with a possibility of shifting to the read operation mode upon the receipt of the second command. The activating state W is a state with a possibility of shifting to the write operation mode upon the receipt of the second command.

The SELFN command, the SELFX command, the PDEN command, and the PDEX command, indicated by thin solid lines, are determined depending on whether a power down signal PD, to be later described, is at its high level or low level. More specifically, when the power down signal PD goes low in the auto refresh mode, the device enters the self refresh mode (SELFN command). When the power down signal PD goes high in the self refresh mode, the device becomes the standby state (SELFX command). When the power down signal PD goes low in the standby state, the device enters the low power consumption mode (PDEN command). When the power down signal PD goes high in the low power consumption mode, the device becomes the standby state (PDEX command).

The thin broken lines indicate that the shifting to the standby state is automatically done after performing the operating modes. After the read operation, the write operation, the mode register setting operation or the auto refresh operation, the device becomes the standby state.

TABLE 1

| function | command | CLK | /CS | FN | BA1–BA0 | A14 | A13 | A12–A9 | A8–A0 |
|---|---|---|---|---|---|---|---|---|---|
| device deselect | DESL | L-H | H | X | X | X | X | X | X |
| possibility of read operation | RDA | L-H | L | H | BA | UA | UA | UA | UA |
| possibility of write operation | WRA | L-H | L | L | BA | UA | UA | UA | UA |

Table 1 indicates several states of signals in the first command. In this table, symbol "L-H" refers to a change from low level to high level; "H" denotes high level; "L" shows low level; "X," high or low level; "BA," a specified bank address; "UA," specified upper address.

The DESL command can be received at the rising edge of a clock signal CLK when the chip select signal /CS is at high level. After the receipt of the DESL command, the device is again set at the standby state. The DESL command holds the unselected state of the device.

The RDA command can be received at the rising edge of the clock signal CLK when the chip select signal /CS is at low level and the function signal FN is at high level. At the same time that the RDA command is received, bank address signals BA1, BA0 are accepted as bank addresses and address signals A14-A0 are accepted as upper addresses (e.g. row addresses). The device becomes the activating state R upon receiving the RDA command.

The WRA command can be received at the rising edge of the clock signal CLK when the chip select signal /CS is at low level and the function signal FN is at low level. At the same time that the WRA command is received, the bank address signals BA1, BA0 are accepted as bank addresses and the address signals A14-A0 are accepted as upper addresses (e.g. row addresses). The device becomes the activating state W upon receiving of the WRA command.

Table 2 shows some states of signals for the acceptance of the second commands. In this table, symbols "V," "WBL0" and "WBL1" refer to either high level or low level and symbol "LA" indicates the specified lower address.

The LAL command is received at the rising edge of the clock signal CLK when the chip select signal /CS is at high level. At the same time that the LAL command is received, bank address signals. BA1, BA0 are accepted as bank addresses and an address signal A14 is loaded as a WBL0 bit, an address signal A13 is accepted as a WBL1 bit, and address signals A12-A0 are accepted as lower addresses (e.g. column addresses). Upon receipt of the LAL command in the activating state R, the device enters the read operation mode for performing the read operation. Upon receiving the LAL command in the activating state W, the device enters the write operation mode for performing the write operation. More specifically, based on the command (RDA or WRA command) that has already been received, the number of operating modes is narrowed down in response to the newly received LAL command. In other words, no operating modes are determined by the LAL command alone.

The MRS command is received at the rising edge of the clock signal CLK when the chip select signal /CS is at low level. At the same time that the MRS command is received, the low levels of the bank address signals BA1, BA0 and address signals A14-A13 are accepted and the specified value is accepted from the address signals A12-A0. The values of such address signals A12-A0 are used to set a mode register 49 as will be described later.

TABLE 2

| function | command | signal name | | | | | | | |
|---|---|---|---|---|---|---|---|---|---|
| | | CLK | /CS | FN | BA1–BA0 | A14 | A13 | A12–A9 | A8–A0 |
| lower address latch | LAL | L–H | H | X | X | WBL0 | WBL1 | X | LA |
| mode register set | MRS | L–H | L | X | L | L | L | V | V |
| auto refresh | REF | L–H | L | X | X | X | X | X | X |

The REF command is received at the rising edge of the clock signal CLK when the chip select signal /CS is at low level. Upon receiving the REF command the device enters the auto refresh mode for performing an auto refresh operation.

The LAL command is commonly used for performing the write or the read operation. Which of the write operation or the read operation is performed is dependent upon the first command after the LAL command. In addition, the MRS command and REF command are acceptable when the chip select signal /CS is at low level.

Therefore, the DRAM of this invention may selectively perform any one of the read operation, the write operation, the mode register setting, and the auto refresh operation by merely using the chip select signal /CS and the function signal FN as command signals. Additionally it is unnecessary to control read/write terminals such as /WE or the like for performing the read and write operations.

Table 3 shows the details of the WBL0 bit and the WBL1 bit as set up with the LAL commands shown in Table 2. The WBL0 bit and the WBL1 bit are used to set a number of write data in the write operation, which will be later described. Burst length BL may refer to the number of data signals capable of being input and output during a single write or read operation.

TABLE 3

| | WBL0 | WBL1 | write data length |
|---|---|---|---|
| BL = 2 | L | X | all data |
| | H | X | first one data |
| BL = 4 | L | L | reserved |
| | H | L | all data |
| | L | H | first two data |
| | H | H | first one data |
| BL = 8 | L | L | all data |
| | H | L | first four data |
| | L | H | first two data |
| | H | H | first one data |

In case the burst length BL is set at "2", the write operation of all data bits is executed when the WBL0 bit is at low level. When the WBL0 bit is at high level, only the first data is written.

In case the burst length BL is set at "4", the write operation of all data bits is executed when the WBL0 bit is at high level and the WBL1 bit is at low level. When the WBL0 bit is at low level and WBL1 bit is at high level, only first two data is written. When both of the WBL0 bit and the WBL1 bit are at high level, only the first data is written.

In case the burst length BL is set at "8", the write operation of all data is executed when the WBL0 bit and the WBL1 bit are both at low level. When the WBL0 bit is at high level and WBL1 bit is at low level, only first four data bits are subject to writing. When the WBL0 bit is at low level and WBL1 is at high level, only first two data is written. When both of the WBL0 and WBL1 bits are at high level, only the first data is written.

After the write operation corresponding to the set number of the write data bits, the device immediately becomes the standby state from the write operation mode. Owing to this, inhibiting any unnecessary write operations results in reducing the time taken for a write cycle.

Table 4 shows some states of signals in the low power consumption mode and the self refresh mode.

The shifting to the low power consumption mode is done when in the standby state the power down signal PD changes from its high level to low level while the chip select signal /CS stays at high level (PDEN command). The low power consumption mode is held by keeping the power down signal PD at low level. As will be described later, all circuits but an input buffer to receive the power down signal PD are inactivated. The low power consumption mode is released when the power down signal PD potentially changes from low level to high level while the chip select signal /CS stays at high level (PDEX command).

The shifting to the self refresh mode is done when in the auto refresh mode the power down signal PD changes from its high level to low level while the chip select signal /CS is at low level (SELFN command). The state of the self refresh mode is held by keeping the power down signal PD at low level. At this time the self refresh operation is performed in continuation. The self refresh mode is disabled when the power down signal PD changes from low level to high level while the chip select signal /CS remains at high level (SELFX command).

Figure 4:
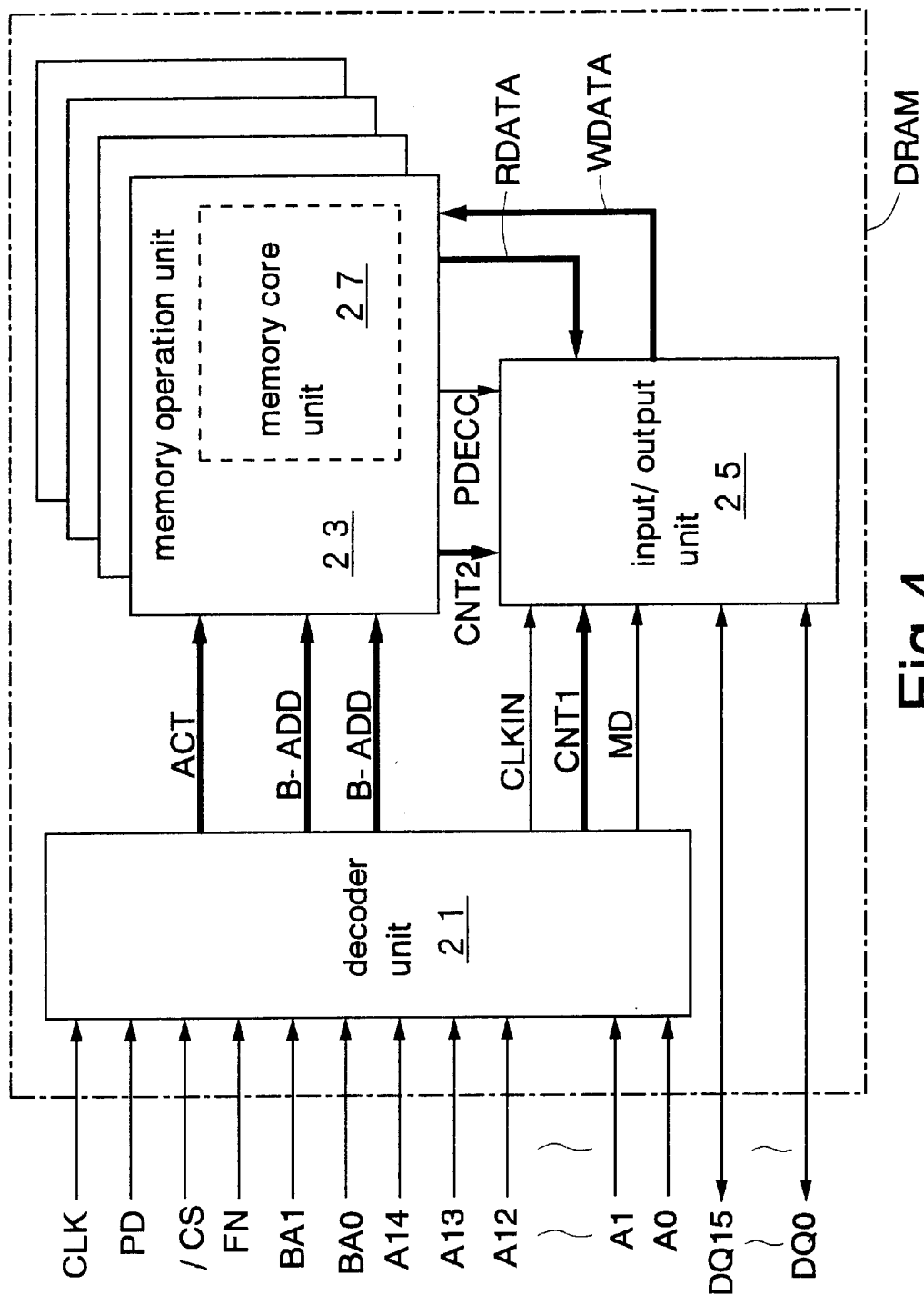
FIG. 4 is a diagram of the whole configuration of a chip in the first embodiment of the method for operating the semiconductor memory device and the semiconductor memory device according to the present invention.

FIG. 4 shows the whole configuration of a DRAM applied to the present invention.

The DRAM comprises a decoder unit 21, four separate memory operation units 23, and an input/output unit 25. The decoder unit 21 is a circuit block for controlling the first stage. The memory operation units 23 are blocks for controlling the second stage. The input/output unit 25 is a block for controlling the third stage. Each of these three blocks has a function of performing a pipeline operation independent of one another. Each memory operation unit 23 has therein a memory core unit 27.

TABLE 4

| function | command | | current state | PD n-1 | n | /CS | FN | BA1–BA0 | A14–A0 |
|---|---|---|---|---|---|---|---|---|---|
| low power consumption | shift operation | PDEN | standby | H | L | H | X | X | X |
| | | — | low power consumption | L | L | X | X | X | X |
| | release | PDEX | low power consumption | L | H | H | X | X | X |
| self refresh | shift operation | SELFN | auto refresh | H | L | L | X | X | X |
| | | — | self refresh | L | L | X | X | X | X |
| | release | SELFX | self refresh | L | H | H | X | X | X |

The decoder unit 21 respectively receives the clock signal CLK, the power down signal PD, the chip select signal /CS, the function signal FN, bank address signals BA1, BA0 and address signals A14-A0 through a clock terminal CLK, a power down terminal PD, a chip select terminal /CS, a function terminal FN, bank address terminals BA1, BA0 and address terminals A14-A0, from the exterior. The decoder unit 21 outputs activating signals ACT, bank address signals. B-ADD, an internal clock signal CLKIN, controlling signals CNT1, and a mode controlling signal MD.

Each of the memory operation units 23 receives the activating signals ACT and the bank address signals B-ADD. Each memory operation unit 23 outputs toward the input/output unit 25 controlling signals CNT2, a predecoding signal PDECC, and read data signals RDATA and receives write data signals WDATA from the input/output unit 25.

The input/output unit 25 receives data input/output signals DQ15-DQ0 through data input/output terminals DQ15-DQ0 from the exterior. The input/output unit 25 receives from the decoder unit 21 the controlling signals CNT1, the internal clock signal CLKIN, and the mode controlling signal MD.

The thick solid lines in the drawing denote a plurality of signal lines. Note here that for the purpose of simplifying explanation, for example, the clock signal CLK will be referred to simply as "CLK signal"; similarly, the chip select signal /CS will be called "/CS signal" for short.

Figure 5:
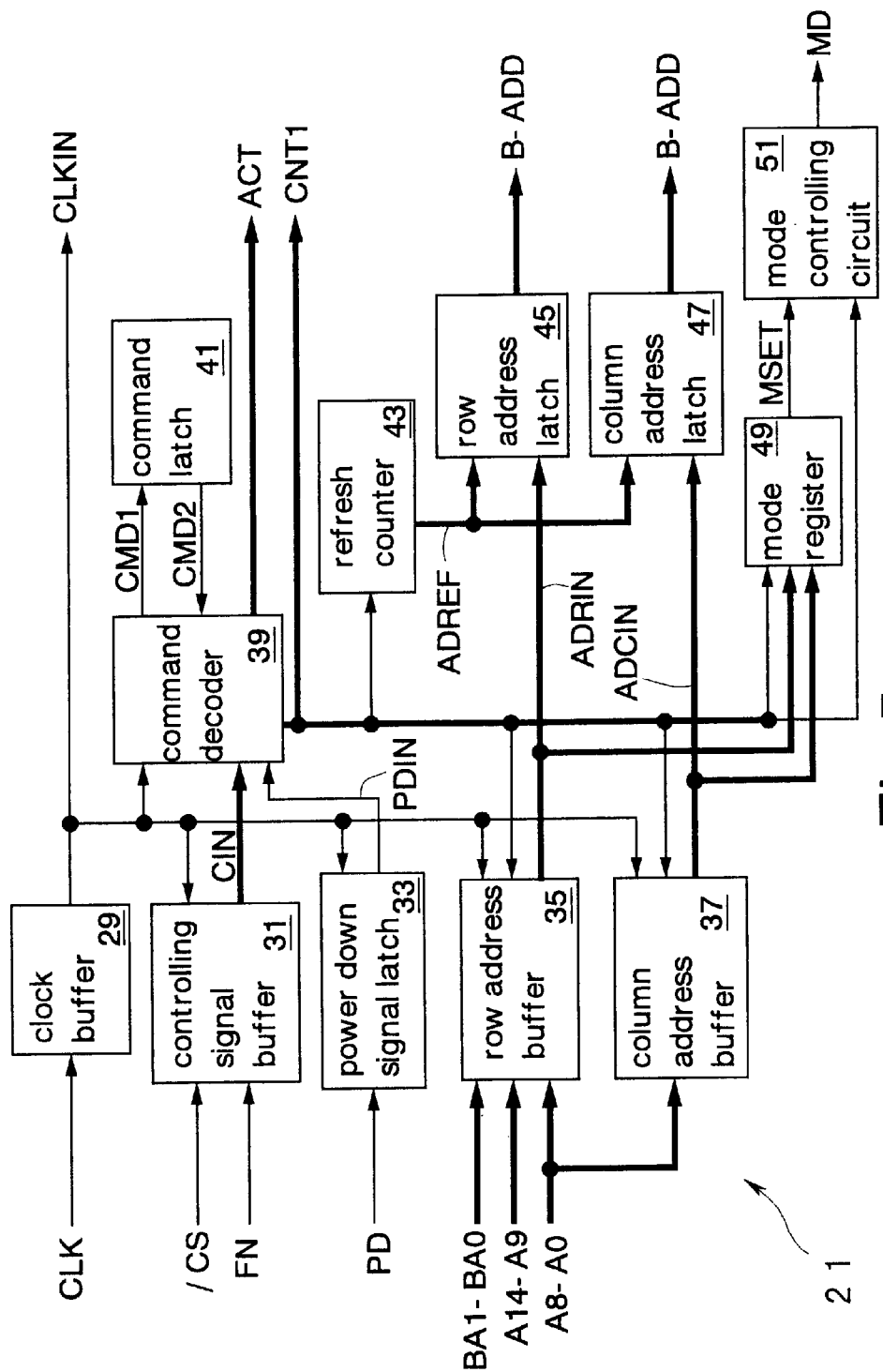
FIG. 5 is a block diagram showing the details of a decode unit of FIG. 4.

FIG. 5 shows the details of the decoder unit 21 in FIG. 4. The decoder unit 21 is a block whose main function is to receive and decode commands and addresses. After having decoded the signals, the decoder unit 21 automatically resets and is ready to receive the next commands and addresses.

The decoder unit 21 includes a clock buffer 29, a controlling signal buffer 31, a power down signal latch 33, a row address buffer 35, a column address buffer 37, a command decoder 39, a command latch 41, a refresh counter 43, a row address latch 45, a column address latch 47, a mode register 49, and a mode controlling circuit 51.

The clock buffer 29 receives the clock signal CLK and outputs the internal clock signal CLKIN. The controlling signal buffer 31 accepts the chip select signal /CS and the function signal FN in synchronization with the internal clock signal CLKIN, and outputs such received signals to the command decoder 39 as internal signals CIN, respectively. The power down signal latch 33 accepts the power down signal PD in synchronization with the internal clock signal CLKIN and then outputs the accepted signal to the command decoder 39 as an internal power down signal PDIN. The row address buffer 35 accepts the bank address signals BA1-BA0 and address signals A14-A0 in synchronization with the internal clock signal CLKIN and outputs such accepted signals to the row address latch 45 and the mode register 49 as internal row address signals ADRIN. The column address buffer 37 accepts address signals A8-A0 in synchronization with the internal clock signal CLKIN and outputs the accepted signals to the column address latch 47 and the mode register 49 as internal column address signals ADCIN. Each of the controlling signals CNT1 supplied to the row address buffer 35 and the column address buffer 37 is used for respectively inactivating the row address buffer 35 and the column address buffer 37 in the low power consumption mode.

The command decoder 39 decodes commands upon the receipt of the internal clock signal CLKIN, internal signals CIN, and the internal power down signal PDIN, and generates the controlling signals CNT1 for controlling other circuits and activating signals ACT to control the memory operation units 23. The controlling signals CNT1 may consist of a plurality of signals for controlling each of the circuits. The command decoder 39 outputs the accepted first command to the command latch 41 as a command signal CMD1. The command decoder 39 receives the information of the first command latched in the command latch 41 through a command signal CMD2. The command latch 41 has a function of latching the information of the first command and storing the state of the device, which is either the activating state R or the activating state W shown in FIG. 3.

The refresh counter 43 receives the specified controlling signal CNT1 and outputs its internally generated refresh address signals ADREF when a current operating mode is either the auto refresh mode or the self refresh mode.

The row address latch 45 outputs either the internal row address signals ADRIN or refresh addresses ADREF as bank address signals B-ADD. The column address latch 47 outputs either the internal column address signals ADCIN or the refresh addresses ADREF as the bank address signals B-ADD.

The mode register 49 is a register for setting an operating state of the device. The mode register 49 receives the internal row address signals ADRIN, internal column address signals ADCIN and a specified controlling signal CNT1 and then outputs a mode setting signal MSET.

The mode controlling circuit 51 receives the information set at the mode register 49 (such as a data latency DL, a burst type BT, a burst length BL as will be described in detail later) through the mode setting signal MSET, and outputs a mode controlling signal MD.

Figure 6:
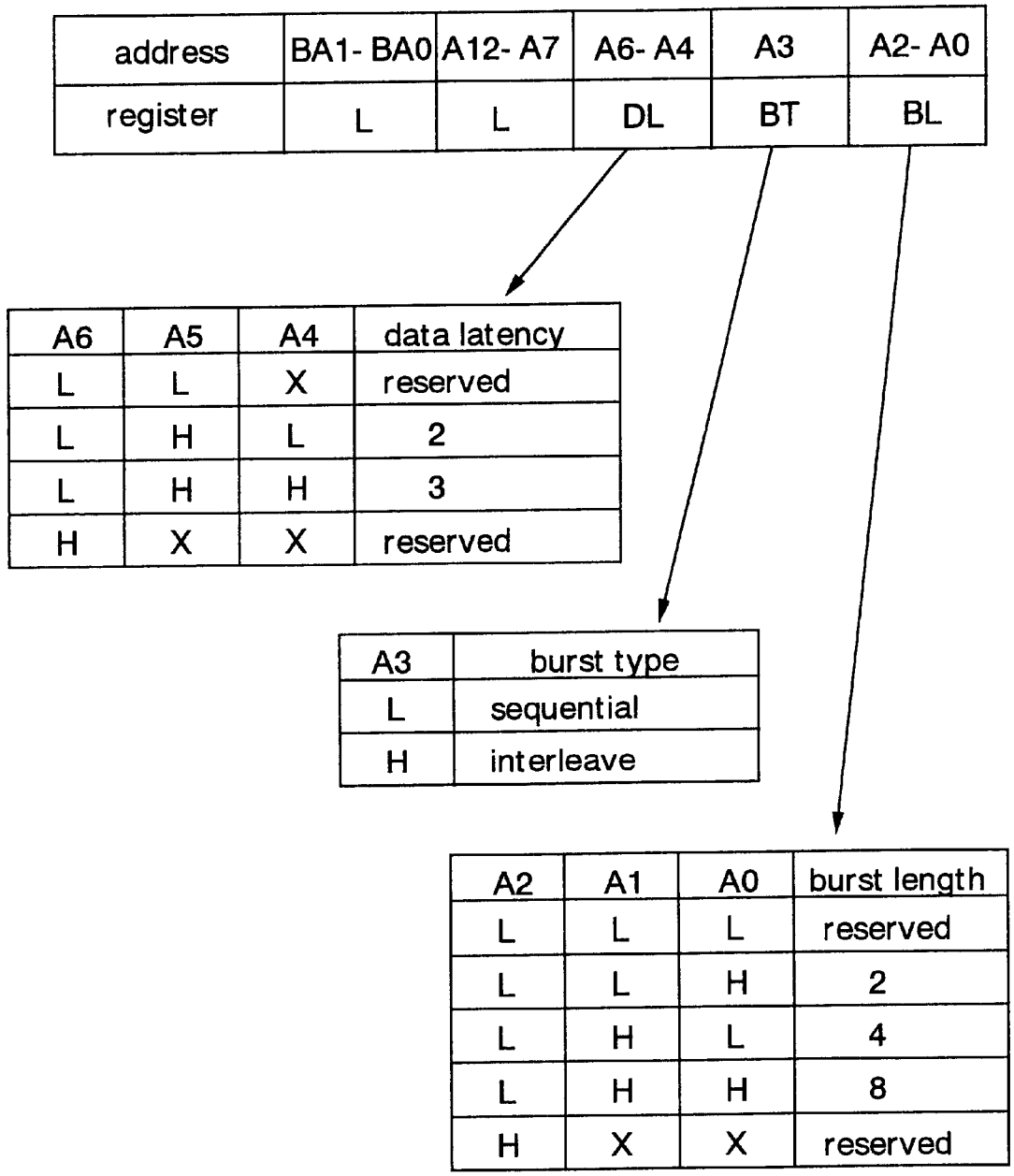
FIG. 6 is a schematic diagram showing the details of a mode register of FIG. 5.

FIG. 6 shows bit contents of the mode register 49. The mode register 49 is of fifteen (15) bits corresponding in number to the bank address signals BA1, BA0 and address signals A12-A0. 8 bits of it which corresponds to the bank address signals BA1, BA0 and the address signals A12-A7 are designed to always write the signals at low level. Another 3 bits corresponding to the address signals A6-A4 are used for setting the data latency DL at either "2" or "3", which latency is for determining an input/output timing of a data signal. One bit corresponding to address signal A3 is used to set the burst type BT, which indicates a sequence of input/output of data signals, at either "sequential" or "interleave". The remaining 3 bits corresponding to address signals A2-A0 are used for setting the burst length BL at any one of "2", "4" or "8".

Figure 7:
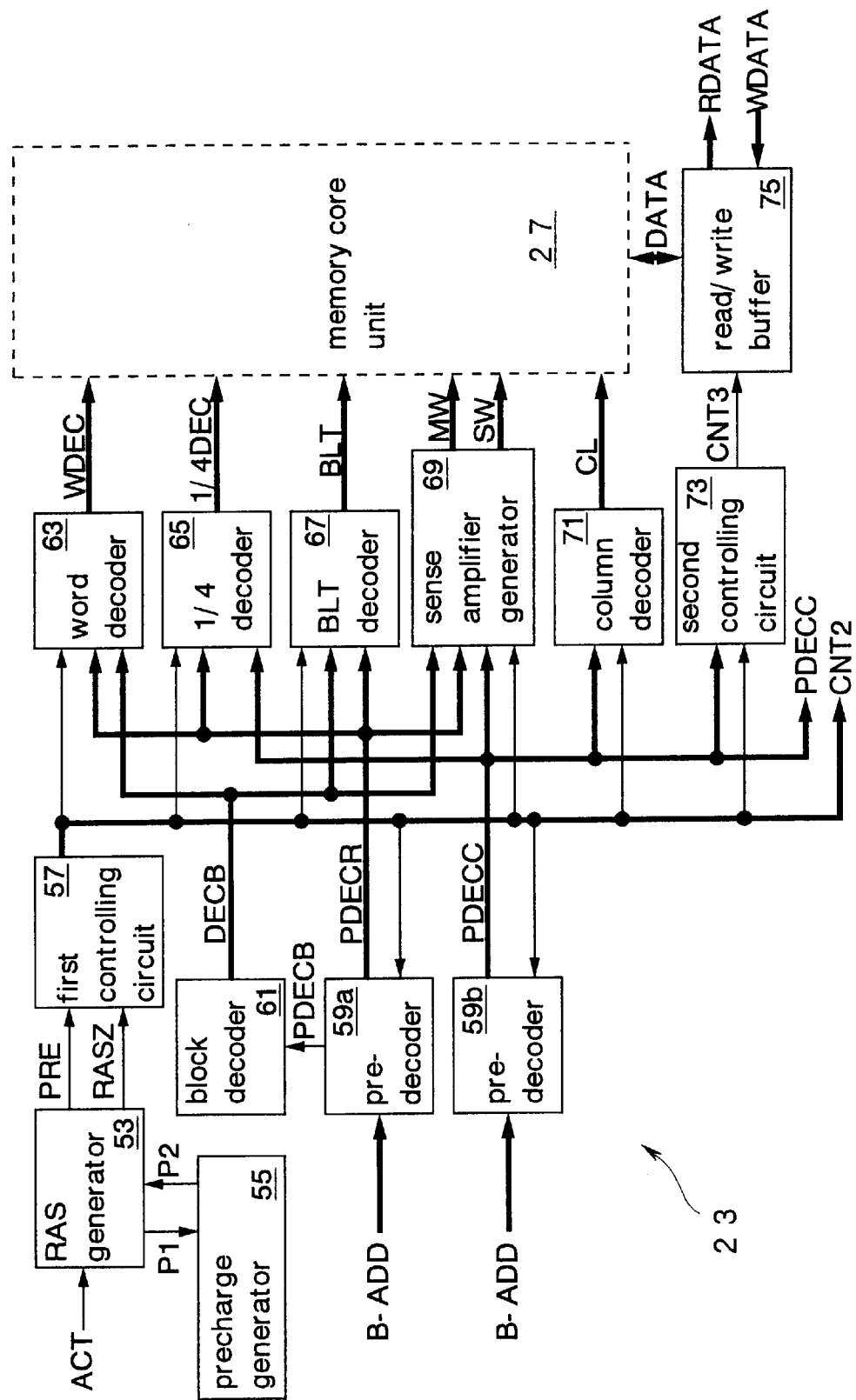
FIG. 7 is a block diagram showing the details of a memory operation unit of FIG. 4.

FIG. 7 shows the details of the memory operation units 23. The memory operation unit 23 includes a RAS generator 53 a precharge generator 55, a first controlling circuit 57, predecoders 59a, 59b, a block decoder 61, a word decoder 63, a quarter (¼) decoder 65, a BLT decoder 67, a sense amplifier generator 69, a column decoder 71, a second controlling circuit 73, and a read/write buffer 75.

The RAS generator 53 receives the activating signal ACT to output a precharge controlling signal PRE and word line selecting signal RASZ to the first controlling circuit 57. The RAS generator 53 also outputs to the precharge generator 55 a controlling signal P1 that has substantially the same timing as that of the word line selecting signal RASZ and receives a controlling signal P2 from the precharge generator 55. The precharge generator 55 outputs the controlling signal P2 a predetermined time after the receipt of the controlling signal P1.

The first controlling circuit 57 receives the precharge controlling signal PRE and the word line selecting signal RASZ and outputs the controlling signals CNT2. The controlling signal CNT2 consists of a plurality of signals, which are supplied to the word decoder 63, the ¼ decoder 65, the BLT decoder 67, the predecoders 59a, 59b, the sense amplifier generator 69, the column decoder 71, the second controlling circuit 73, and the input/output unit 25 in, FIG. 5, respectively. Two controlling signals CNT2 are supplied to the input/output unit 25.

The predecoder 59a receives the specified controlling signal CNT2 and bank addresses B-ADD and outputs a predecoding signals PDECR and a predecoding signal PDECB. The predecoder 59b receives the specified controlling signal CNT2 and bank addresses B-ADD and outputs predecoding signals PDECC.

The block decoder 61 receives the predecoding signal PDECB from the predecoder 59a and outputs decoding signals DECB.

The word decoder 63 receives the specified controlling signal CNT2, the decoding signals DECB and the predecoding signals PDECR and outputs to the memory core unit 27 main word line decoding signals WDEC.

The ¼ decoder 65 receives the specified controlling signal CNT2 and the predecoding signals PDECR, PDECC and outputs sub-word line decoding signals ¼ DEC to the memory core unit 27. The sub-word line decoding signals ¼ DEC are for selecting any one of the four sub-word lines that branch from a main word line selected.

The BLT decoder 67 receives the specified controlling signal CNT2, the decoding signals DECB and the predecoding signals PDECR and outputs bit line transfer decoding signals BLT to the memory core unit 27.

The sense amplifier generator 69 receives the specified controlling signal CNT2, the decoding signals DECB and the predecoding signals PDECR, PDECC and outputs sense amplifier activating signals MW, SW to the memory core unit 27.

Figure 8:
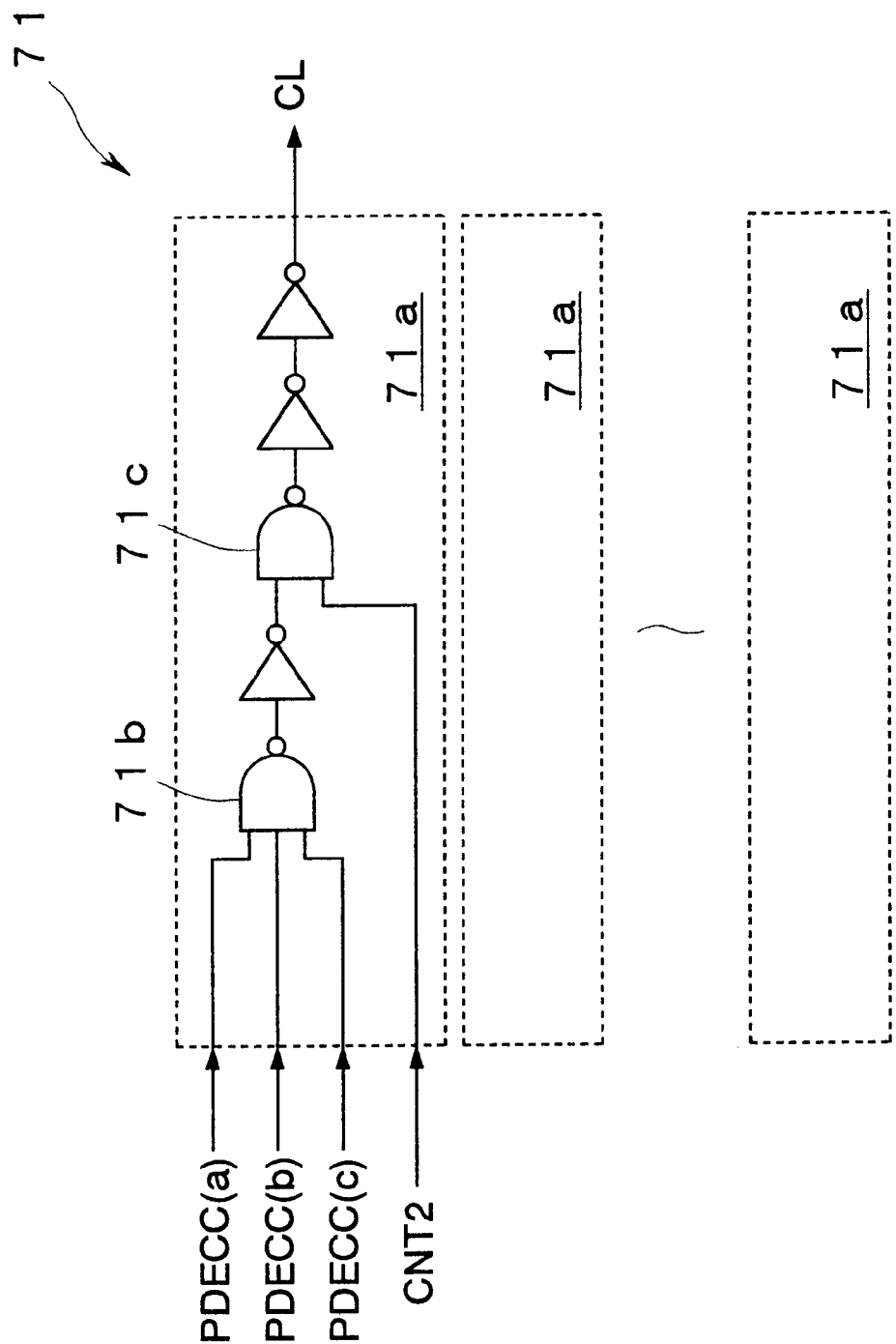
FIG. 8 is a circuit diagram showing the details of a column decoder of FIG. 7.

The column decoder 71 receives the specified controlling signal CNT2 and the predecoding signals PDECC and outputs to the memory core unit 27 column line selecting signals CL for selecting a column selecting line (not shown). As shown in FIG. 8, the column decoder 71 is configured from a plurality of decoding circuits 71a. Each decoding circuit 71a comprises NAND gates 71b, 71c cascade connected through an inverter and a plurality of inverters. The NAND gate 71b on the input side receives the predecoding signals PDECC(a), PDECC(b), PDECC(c) The NAND gate 71c on the output side receives an output signal of the NAND gate 71b and the controlling signal CNT2.

The second controlling circuit 73 shown in FIG. 7 receives the specified controlling signal CNT2 and the predecoding signals PDECC and outputs a controlling signal CNT3 for control of the read/write buffer 75.

The read/write buffer 75 operates under control of the controlling signal CNT3 so that this buffer transfers write data signals WDATA sent from the input/output unit 25 to the memory core unit 27 during the write operation; during the read operation, it transfers read data signals RDATA outputted from the memory core unit 27 to the input/output unit 25.

Figure 9:
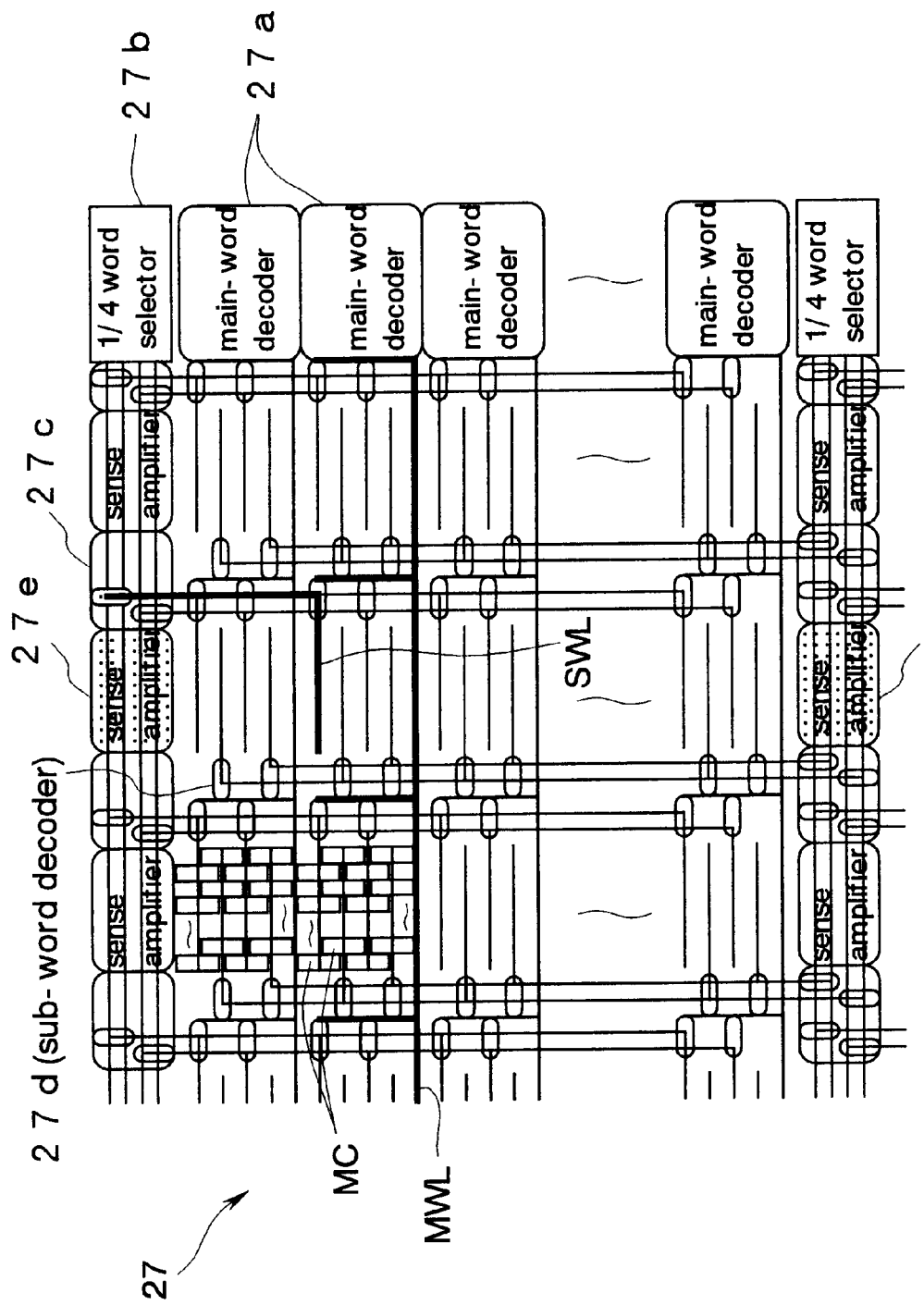
FIG. 9 is a block diagram showing the details of a memory core unit of FIG. 7.

FIG. 9 shows a brief description of the memory core units 27 of FIG. 4. The memory core unit 27 includes main-word decoders 27a, ¼ word selectors 27b, sub-word line drivers 27c, sub-word decoders 27d, sense amplifiers 27e, and memory cells MC, all of which are laid out in plural.

Each of the main-word decoders 27a receives the main-word line decoding signal WDEC and selects the specified main-word line MWL. The ¼ word selectors 27c, the sub-word line drivers 27b, and the sub-word decoders 27d receives the sub-word line decoding signal ¼ DEC and selects the specified sub-word line SWL. For example, the main-word line MWL and the sub-word line SWL as indicated by thick lines are selected in a single event of read operation. Data is outputted from the memory cells MC connected to the selected main-word line MWL and the sub-word line SWL.

The sense amplifier 27e amplifies data as outputted from the memory cells MC during the read operation and rewrites the amplified data into the memory cells.

Figure 10:
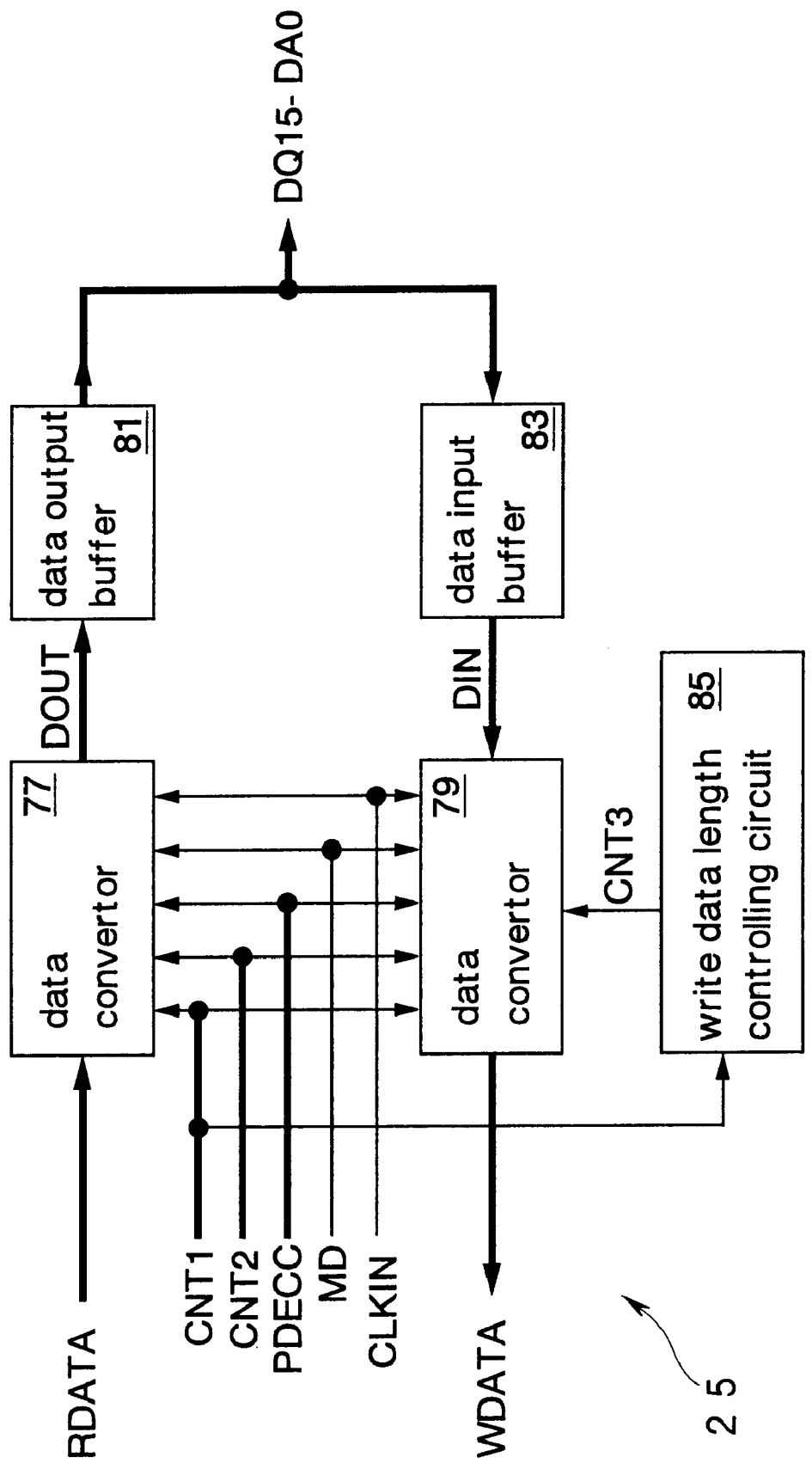
FIG. 10 is a block diagram showing the details of an input/output unit of FIG. 4.

FIG. 10 shows the details of the input/output unit 25. The input/output unit 25 includes a data converter 77 for read operation, a data converter 79 for write operation, a data output buffer 81, a data input buffer 83, and a write data length controlling circuit 85.

The data converter 77 converts a parallel read data signals RDATA supplied from the read/write buffer 75 of FIG. 7 into serial data signals and outputs the converted data DOUT to the data output buffer 81. The data converter 79 converts serial read data DIN supplied from the data input buffer 83 into parallel data and outputs the converted write data signals WDATA to the read/write buffer 75 of FIG. 7. The data converters 77, 79 receive the specified controlling signals CNT1, CNT2, the predecoding signals PDECC, the mode controlling signal MD having the information of the data latency DL and the internal clock signal CLKIN, respectively.

The write data length controlling circuit 85 receives the specified controlling signal CNT1 and outputs to the data converter 79 a controlling signal CNT3 for controlling the data length during the write operation. The write data length is specified by the WBL0, WBL1 bits as supplied from the address terminals A14-A13 upon inputting an LAL-command during the write operation (see Table 3).

A read operation as an exemplary operation of the DRAM will be explained below.

As shown in FIG. 3, the read operation is performed such that the device enters the read operation mode by the LAL command (second command) after the device becomes the activating state R from the standby mode by an RDA command (first command).

Figure 11:
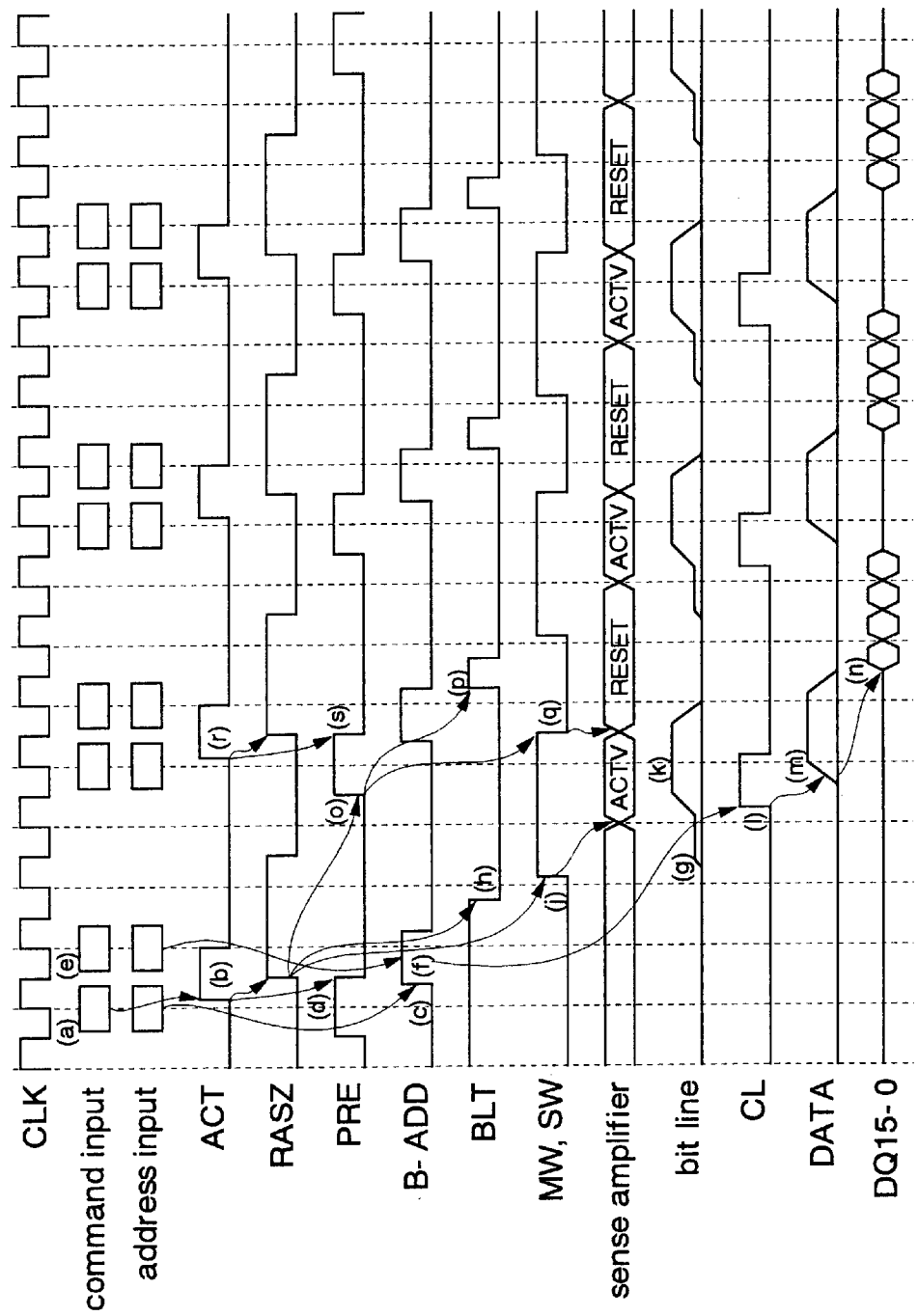
FIG. 11 is a timing chart showing the method for operating the semiconductor memory device and a read operation in the first embodiment of the semiconductor memory device according to the present invention.

FIG. 11 shows the timings of some major signals during the read operation.

Firstly, the controlling signal buffer 31 of FIG. 5 accepts the first command in synchronization with the rising edge of the CLK signal (FIG. 11(a)). The command decoder 39 receives an internal signal CIN accepted by the controlling signal buffer 31 and then changes the level of the ACT signal to high level for a predetermined period (FIG. 11(b)).

The row address buffer 35 of FIG. 5 accepts, at the same time that the first command is accepted, addresses from BA1-BA0 signals and A14-A0 signals. The row address latch 45 outputs the internal row address signals ADRIN outputted from the row address buffer 35 as the bank addresses B-ADD (FIG. 11(c)).

In response to the RDA command, the device becomes the activating state R. The read operation and the write operation are distinguished over each other at this time since the activating state R never enters the write operation mode. In other words, the number of operating modes are narrowed down in response to the acceptance of the first command.

Upon receiving an ACT signal, the RAS generator 53 of FIG. 7 changes the level of the word line selecting signal RASZ to high level and that of the precharge controlling signal PRE to low level for the predetermined period (FIG. 11(d)). Thereafter, precharging the bit lines is terminated. Further, the specified main word line MWL and the sub-word line SWL are selected without receiving the second command. In the state that the first command has been accepted, the control of the second stage gets started, that is, the memory operation unit 23 is made active for operation.

At this point, the column decoder 71 receives a controlling signal CNT2 at the NAND gate 71c prior to receiving the predecoding signals PDECC(a), PDECC(b), and PDECC(c) as shown in FIG. 8. The column decoder 71 becomes the standby state for receiving the predecoding signals PDECC (a), PDECC (b), and PDECC(c) so that the operation is speeded up.

The controlling signal buffer 31 of FIG. 5 accepts the second command at the rising edge of the CLK signal next to that of the first command (FIG. 11(e)). Therefore, the information obtained when inputting the second command is reflected on the control in a short time after the input of the first command. This results in minimizing the delay in the control procedure corresponding to the second command when commands are input at twice. The control procedure mentioned above is also applicable to the WRA command.

The command decoder 39 receives the internal signal CIN and then decodes the inputted command as the LAL command. The state of the device enters the read operation mode by the LAL command. In other words, the operating mode is determined by inputting commands at twice. Since the number of operating modes is sequentially narrowed down, the terminals required for the command inputs are reduced in number.

The column address buffer 37 accepts the addresses as A8-A0 signals at the same time that the second command is accepted. The column address latch 47 outputs internal column address signals ADCIN outputted from the column address buffer 37 as the bank addresses B-ADD (FIG. 11(f)). As the addresses necessary for performing the read operation is accepted at twice, the address terminals are significantly reduced in number. This results in a decrease in number of address pads, address input circuits, or the like thus reducing the chip size accordingly. The reduction is accomplished by reducing the number of terminals, which gives limits to the package size.

It should be noted that after the receipt of the first command, the memory operation unit 23 continues operating. Read data are outputted to a bit line (not shown) from the memory cells MC which are connected to the sub-word line SWL selected (FIG. 11(g)).

The BLT decoder 67 of FIG. 7 receives the CNT2 signal and the specified address to change the level of the BLT signal to low level (FIG. 11(h)). The sense amplifier generator 69 receives the CNT2 signal and the specified address and changes the level of the sense amplifier activating signals MW, SW to high level (FIG. 11(j)).

Due to the high level of the sense amplifier activating signals MW, SW, the sense amplifier is activated (at "ACTV" in FIG. 11) and amplifies the signal level of a bit line (FIG. 11(k)).

The column decoder 71 receives the CNT2 signal and the predecoding signals PDECC and changes the level of the column line select signal CL to high level (FIG. 11(l)). Due to the high level of the CL signal, the data signals DATA are outputted from the memory core unit 27 to the read/write buffer 75 (FIG. 11(m)).

The read/write buffer 75 outputs the data signals DATA as read data signals RDATA to the data converter 77 of FIG. 10. The data converter 77 applies parallel-to-serial conversion to the read data signals RDATA and outputs the converted signals as data input/output signals DQ15-DQ0 through the data output buffer 81 (FIG. 11(n)).

The RAS generator 53 of FIG. 7 receives the output signal P2 from the precharge generator 55 and changes the level of the PRE signal to high level (FIG. 11(o)). Due to the low level of the PRE signal, the first controlling circuit 57 respectively outputs controlling signals CNT2 to the BLT decoder 67 and the sense amplifier generator 69. The BLT decoder 67 changes the level of the BLT signal to high level and terminates outputting data from the sense amplifier(s) (FIG. 11(p)). The sense amplifier generator 69 changes the levels of the MW signal and the SW signal to low level. (FIG. 11(q)) and inactivates the sense amplifiers ("RESET" of FIG. 11).

Further, at the fourth clock signal after the acceptance of the first command, the first command for the next read operation is accepted. The ACT signal stays at high level for a predetermined period upon the receipt of the input command (FIG. 11(r)). Due to the high level of the ACT signal, the level of the PRE signal goes low thus performing the bit line precharging (FIG. 11(s)). In other words the precharge operation is automatically executed inside of the device in response to the first command in the next cycle.

At this time the memory operation unit 23 and the input/output unit 25 performs the read operation in the first read cycle. Such pipeline operation is attainable because of the fact that the decode unit 21, the memory operation unit 23 and the input/output unit 25 are operable independently of one another. Thereafter, the acceptance of the first command in the next read operation is done at intervals of four clock signals.

In the timing diagram shown in FIG. 11, an operation of one of four banks is shown. In practice, read data can be output in synchronization with each clock pulse without intervals by alternately providing access to two banks at intervals of two clocks.

Next, the write operation will be explained below.

The write operation is substantially the same as the read operation described above up to the address acceptance based on the second command.

First, as shown in FIG. 3, when receiving the WRA command as the first command in the standby state, the device becomes the activating state W. Simultaneously the upper write addresses (BA1-BA0, A14-A0) are accepted.

Thereafter, upon accepting the LAL command as the second command, the device enters the write operation mode. Simultaneously, the lower write addresses (A8-A0) and write data lengths (WBL0, WBL1) are accepted. Additionally, in synchronization with the CLK signal, the write data (DQ15-DQ0) are accepted in succession.

The number of events for accepting write data is determinable with the burst length set at the mode register being as its maximal number. In actual acceptance, the number of events is determined depending upon the length of write data as accepted simultaneously with the second command. For instance, where the burst length is set at "4", when WBL0, WBL1 accepted as write data lengths are at low level and high level respectively, the number of events for accepting the write data is "2" as shown in Table 3. Based on the write data length accepted together with the second command at the same time, the number of events for the accepting is directly controlled by the write data length controlling circuit 85; accordingly, when a plurality of data bits are accepted in succession, the write data length may be readily controlled. Since it is possible to control the write data length only by the input/output unit 25, the write data length as accepted upon inputting the second command is used for control of such write operation with allowance.

The write data accepted in succession are sequentially supplied through the data input buffer 83 shown in FIG. 10 to the data converter 79. The data converter 79 converts such serial data to parallel data. The data converter 79 also outputs the converted data to the memory operation unit 23 as write data WDATA. The memory operation unit 23 writes the data into specified memory cells.

Here, the input/output unit 25 and the memory operation unit 23 operate at the set number of events for the accepting. After these operations, the write operation mode is completed and the device becomes the standby state. To be brief, data unnecessary to be written (a part longer than the data length specified) are not controlled so that the time taken for the write operation may be saved. As a result, the input timing of the first command is festinated in the next cycle.

The mode register setting mode will next be explained below.

The shifting to the mode register setting mode is done upon receipt of the MRS command as the second command while the device is in the activating state R. When shifting to the mode register setting mode at the same time that the MRS command is accepted, the BA0-BA1 signals and the A14-A0 signals are accepted to set a value of the mode register. The mode register setting mode without accompanying any internal operation may set the specified value within a predetermined period even when such control procedure starts after receipt of the second command. At the time of inputting the first command, it is not required to set the specified value of the mode register so that it is no longer necessary to hold the setup value until the second command is input. As a result, it is possible to prevent the complication of controlling circuit.

The auto refresh mode will next be discussed below.

The shifting to the auto refresh mode is done upon receipt of the REF command as the second command while the device is in the activating state W. As it is not required during the auto refresh mode to input/output data to and from the exterior, the auto refresh mode may set the specified value within a predetermined period even when such control procedure starts after receipt of the second command as input thereto.

Upon receiving the REF command, the device unselects the main-word line MWL and the sub-word line SWL which have been selected by inputting the first command. Thereafter, the device selects the main-word line MWL and the sub-word line SWL which correspond to addresses as generated by the refresh counter 43 of FIG. 5. Owing to this, the refresh operation may be performed with reliability.

The self refresh mode will next be explained below.

The shifting to the self refresh mode is done when the level of a PD signal changes to a low level in the auto refresh mode. In other words, monitoring such PD signal other than by command input makes it possible for the device to shift the self refresh mode during the auto refresh mode.

A difference between the auto refresh and the self refresh is that the former is given a refresh timing from the exterior whereas the latter generates the timing by itself. An identical circuit is used for both operating the refresh counter 43 and performing a refresh operation. Accordingly, the shifting to the self refresh mode from the auto refresh mode is continuously and smoothly performed, consequently, it is possible to shorten the time required for the shifting.

The low power consumption mode will be explained below.

The shifting to the low power consumption mode is done when the level of the PD signal changes to a low level in the standby state. More specifically, monitoring the PD signal other than by command input permits the device to enter the low power consumption mode during the standby state. The low power consumption mode is one of the states of the device and is directly irrespective of the access operation. The shifting to the low power consumption mode is controlled by receiving the PD signal in the standby state. As a result the usability is improved.

In the method for operating the semiconductor memory device and the semiconductor memory device according to the embodiment as described above, the information necessary for determining the operating mode is accepted at twice. Accordingly, it is possible to reduce the number of terminal required for inputting commands. In this embodiment, the five different modes (the standby mode, the read operation mode, the write operation mode, the mode register setting mode, and the auto refresh mode) can be controlled by the chip select signal /CS and function signal FN. In case a dedicated terminal is provided for command input, the requisite number of the terminal may be further reduced. This makes it possible to reduce associative input pads, circuits, or the like, thereby reducing the chip size. The reduction is accomplished by reducing the number of terminals, which gives limits to the package size.

Upon input of the first command, the number of operating modes is narrowed down while the write and read operation modes are distinguished. After the completion of inputting the first command, a circuit common to both the write and read operation modes is initiated. Thus, it is possible to activate the circuit necessary for both the write and read operations to thereby shorten the access time.

At the input of the first command, part of addresses necessary for performing the write or read operation is accepted when the operating mode determined by the second command is either the write or read operation mode. Accordingly, since the addresses necessary for the write or read operation can be accepted at twice, the number of address terminals can be significantly reduced. This makes it possible to reduce address input pads, address input circuits, or the like, thereby reducing the chip size.

When receiving the REF command as the second command during the activating state W, the shifting to the auto refresh mode is done. As the auto refresh mode does not require to input/output data to and from the exterior, it may set the specified value within the predetermined period even when such control procedure starts after receipt of the second command.

Upon receiving the MRS command as the second command during the activating state R, the shifting to the mode register setting mode is done. As the mode register setting mode accompanies no internal operations, it may set the specified value within the predetermined period even when such control procedure starts after receipt of the second command.

Since it is not required to hold the value accepted for setting the mode register 49, it is possible to prevent the complication of the controlling circuit.

The shifting of operating modes is in control by monitoring the PD signal other than by command input. Accordingly, for example, the shifting to the self refresh mode is done during the auto refresh mode and the shifting to the low power consumption mode is done during the standby mode.

When receiving the low level of the PD signal during the auto refresh mode, the shifting to the self refresh mode is done. Therefore, the shifting to the self refresh mode from the auto refresh mode is continuously and smoothly performed, as a result, it is possible to shorten the time required for the shifting.

When receiving the high level of the PD signal in the standby state, the standby state is held. Accordingly, monitoring the low level of the PD signal makes it possible to shift to another operating mode without receiving any command during the standby state.

When receiving the low level of the PD signal in the standby state, the shifting to the low power consumption mode is done. Thus, the shifting to such low power consumption mode directly unrelated to the access operation can be readily performed, which results in improving the usability.

At the same time that the first command is accepted, the addresses necessary for selection of the main-word line MWL and sub-word line SWL is accepted. This makes it possible to operate the memory operation unit 23 after the acceptance of the first command without receiving the second command and select the predetermined main-word line MWL and sub-word line SWL. Accordingly, during the read operation, merely accepting the first command enables data stored in the specified memory cell to be transmitted in advance to the bit line, thereby shortening an access time. During the write operation, mere acceptance of the first command makes it possible to connect the memory cell, expected to be written, to the bit line, thus shortening an access time.

The main-word line MWL and the sub-word line SWL that have been selected by the first command are unselected when the shifting to the auto refresh mode is done. The main-word line MWL and the sub-word line SWL corresponding to an address generated by the refresh counter 43 are selected. Therefore, the refresh operation can be reliably performed.

The controlling signal buffer 31 accepts the second command at the next rising edge of the CLK signal which comes after the acceptance of the first command. This makes it possible to reflect the information obtainable upon inputting the second command on the control in a short time from input of the first command. As a result, it is possible to minimize a delay in the control corresponding to the second command when commands are inputted at twice.

After having accepted the first command, the column decoder 71 receives the controlling signal CNT2 prior to receipt of the predecoding signals PDECC as generated by input of the second command, and then activates the NAND gate 71c. This enables the column decoder 71 to operate at high speed.

The write data controlling circuit 85 directly controls, during data writing, the number of events for accepting data corresponding to the length of data to be written. This makes it possible to accept only write data without performing any complicated control procedures, when accepting a plurality of data in succession. As the write data length is controllable only by the input/output unit 25, the control may be reliably carried out by merely accepting the information upon inputting the second command.

Figure 12:
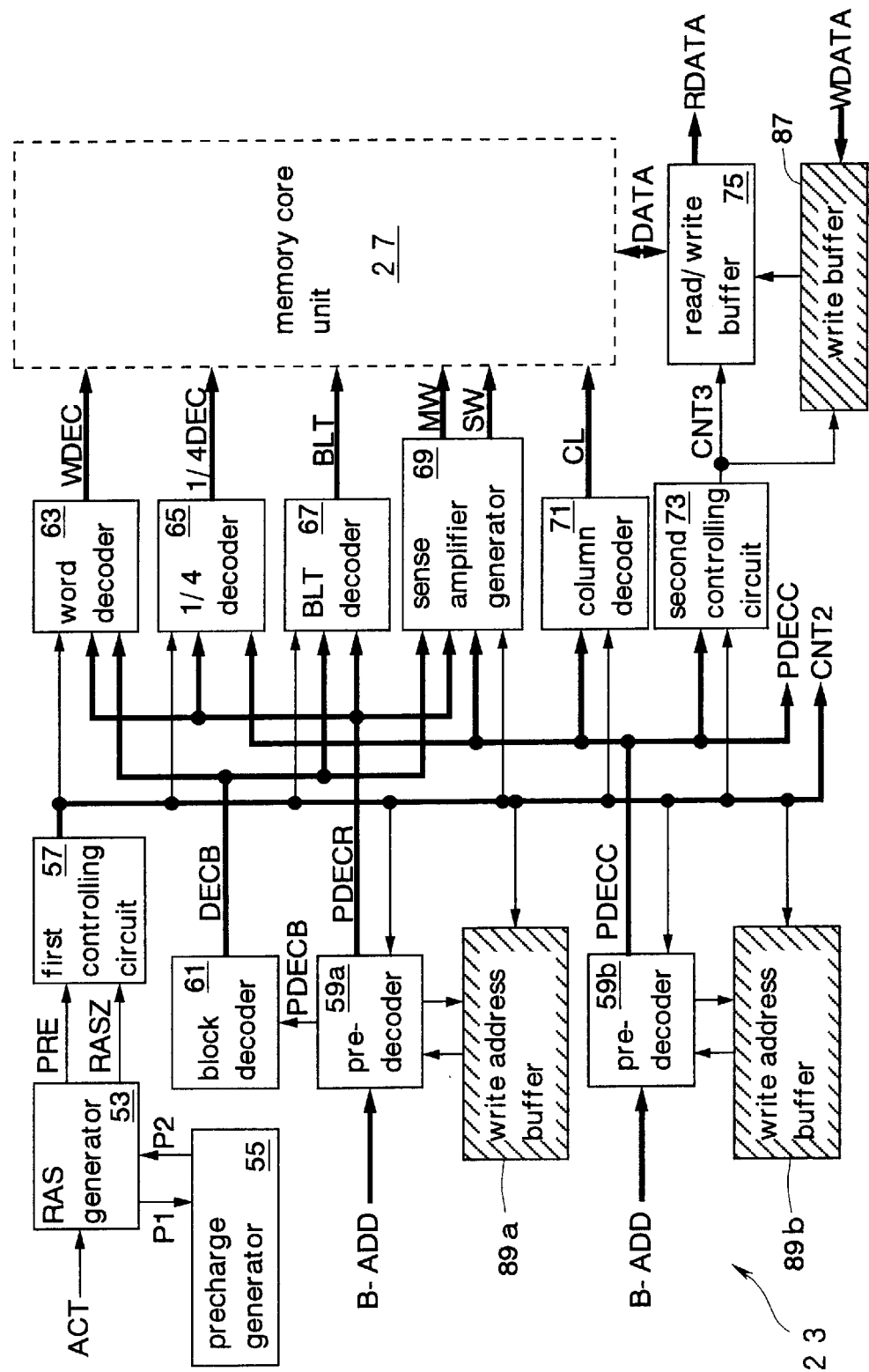
FIG. 12 is a block diagram showing another example of the configuration of the memory operation unit.

Additionally, FIG. 12 shows another exemplary configuration of the memory operation unit 23.

This memory operation unit 23 includes a write buffer 87 and the write address buffers 89a, 89b. The remaining circuits are the same as those shown in FIG. 7. The write buffer 87 receives the write data WDATA, temporarily retains the data according to the specified controlling signal CNT2, and outputs to the read/write buffer 75. The write address buffers 89a, 89b receive the specified controlling signal CNT2 for controlling predecoders 59a, 59b. The buffers 89a, 89b temporarily retain bank addresses B-ADD which are to be supplied from the exterior.

The memory operation unit 23 shown in FIG. 12 can perform the write operation by using the write data and write address that have been accepted in the previous write operation mode. In this case the write cycle is completed early because the write operation gets started during the write operation mode by using the previously accepted write address and write data. Therefore, it is possible to expedite the start of the circuit operation of the read cycle in case of performing the read operation after the write operation.

Figure 13:
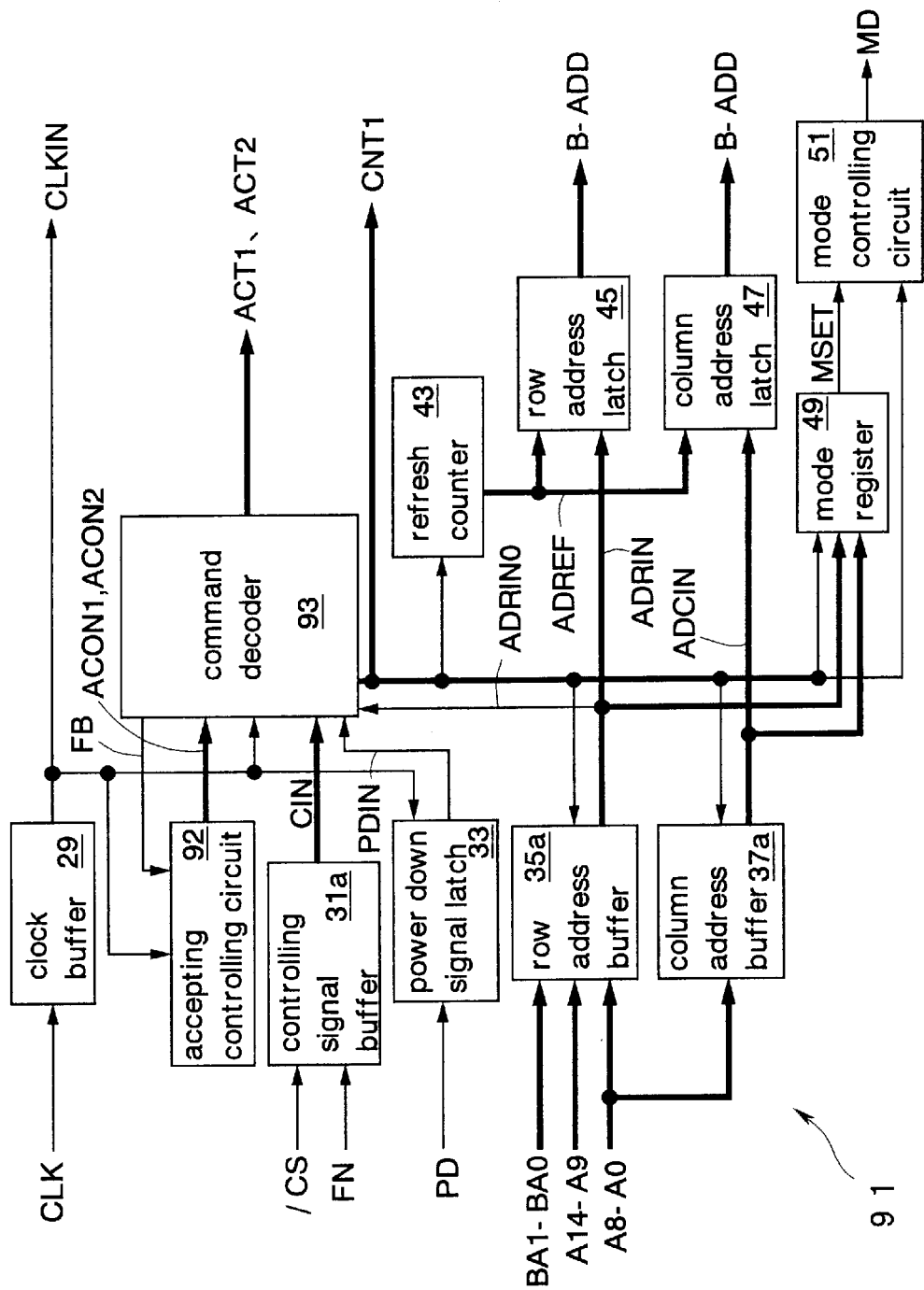
FIG. 13 is a block diagram showing the second embodiment of the semiconductor memory device according to the present invention.

FIG. 13 shows a semiconductor memory device of the second embodiment according to the present invention. The circuits same as those of the first embodiment will be indicated by identical reference numbers and the description thereof will be omitted here.

This embodiment is different from the first embodiment in a decoder unit 91. The remaining part of this embodiment is the same as in the first embodiment.

The decoder unit 91 includes a clock buffer 29, an accepting controlling circuit 92, a controlling signal buffer 31a, a power down signal latch 33, a row address buffer 35a, a column address buffer 37a, a command decoder 93, a refresh counter 43, a row address latch 45, a column address latch 47, a mode register 49, and a mode controlling circuit 51.

Unlike the first embodiment, the controlling signal buffer 31a, the row address buffer 35a and the column address buffer 37a receive respective signals asynchronous with the internal clock signal CLKIN. The accepting controlling circuit 92 receives the internal clock signal CLKIN along with a feedback signal FB from the command decoder 93 and then outputs accepting controlling signals ACON1, ACON2. The command decoder 93 receives the internal clock signal CLKIN, accepts the controlling signals ACON1, ACON2, the internal signals CIN, the internal power down signal PDIN and the internal row address signal ADRIN0, decodes the operating command, and outputs the controlling signal CNT1 and the activating signals ACT1, ACT2 for controlling other circuits. The circuit configuration and its interconnection are the same as those in the first embodiment except those mentioned above.

Figure 14:
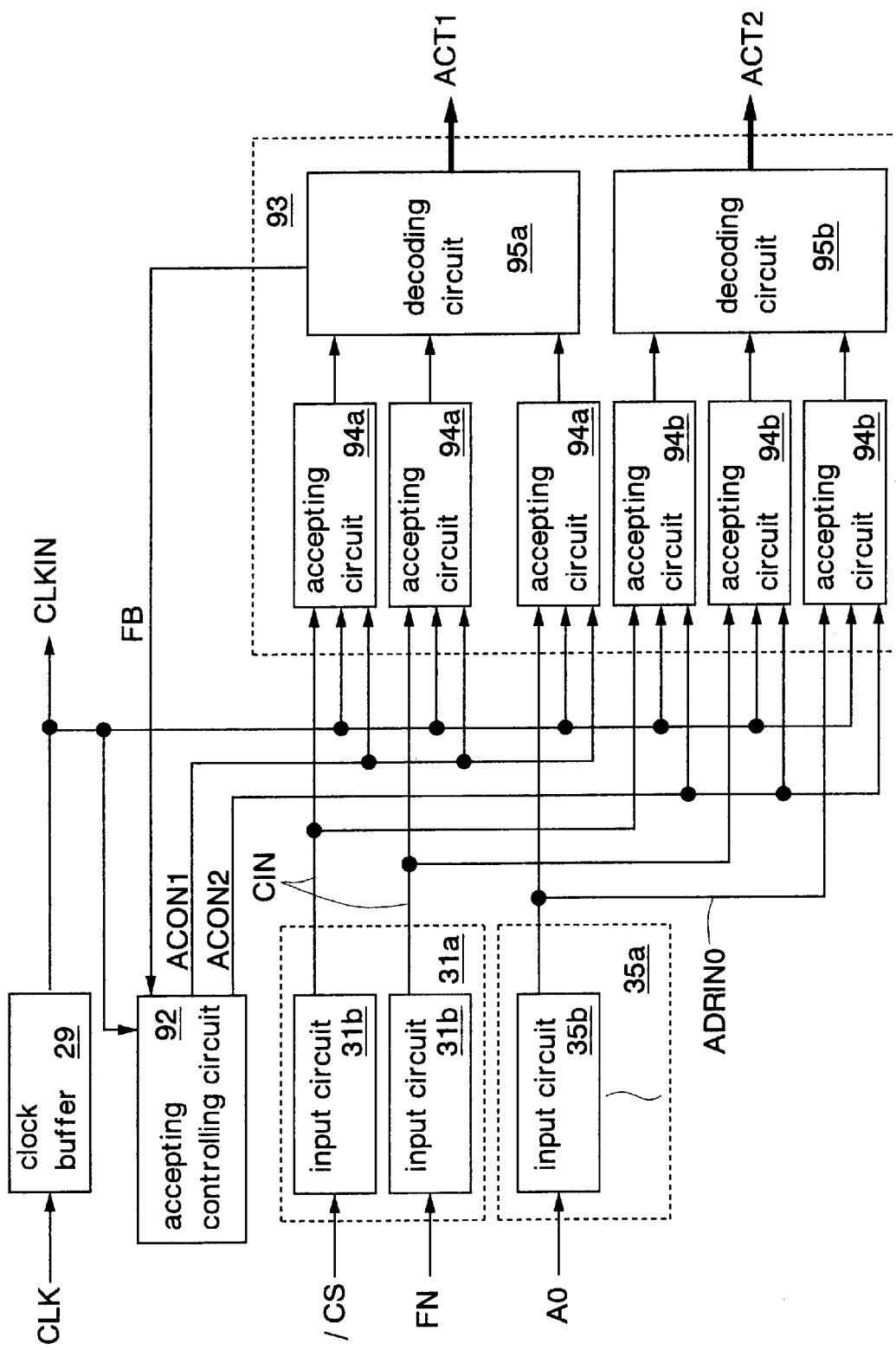
FIG. 14 is a block diagram showing the details of a buffer and a command decoder.

FIG. 14 shows the details of the controlling signal buffer 31a, the row address buffer 35a, and the command decoder 93.

The controlling signal buffer 31a and the row address buffer 35a include a plurality of input circuits 31b, 35b for receiving incoming signals, respectively. Internal signals CIN and the internal row address signal ADRIN0 being output from the input circuits 31b, 35b are output to accepting circuits 94a and accepting circuits 94b which correspond to the activating signals ACT1, ACT2 of the command decoder 93 respectively.

The command decoder 93 includes three accepting circuits 94a and a decoding circuit 95a corresponding to activating signals ACT1, and also includes three accepting circuits 94b and a decoding circuit 95b corresponding to activating signals ACT2. Each accepting circuit 94a is activated at activation of the accepting controlling signal ACON1 and accepts either the internal signal CIN or the internal row address, signal ADRIN0 in synchronization with the internal clock signal CLKIN and then outputs the accepted signals to the decoding circuit 95a. Each accepting circuit 94b is activated at activation of the accept controlling signal ACON2 and accepts either the internal signal CIN or the internal row address signal ADRIN0 in synchronization with the internal clock signal CLKIN and then outputs the accepted signals to the decoding circuit 95b. The decoding circuits 95a, 95b outputs decoded results as activating signals ACT1, ACT2. The decoding circuit 95a outputs the feedback signal FB to the accepting controlling circuit 92.

In the semiconductor memory device of this embodiment, firstly in its inactivating state, the accepting controlling circuit 92 activates the accept controlling signal ACON1 and inactivates the accepting controlling signal ACON2 inactivated in response to inactivation of the feedback signal FB.

Then, upon inputting the first command, the command decoder 93 activates the accepting circuit 94a in response to the accept controlling signal ACON1 and outputs the decoded results to a predetermined circuit as the activating signal ACT1. At this time the accepting circuit 94b is inactivated. In other words, the chip select signal /CS, the function signal FN, and the row address signal A0 corresponding to the first command are decoded by the decoding circuit 95a. The decoding circuit 95a activates the feedback signal FB at substantially the same timing as that of outputting the activating signal ACT1.

The accepting controlling circuit 92 activates the accepting controlling signal ACON2 and inactivates the controlling signal ACON1 in response to activation of the feedback signal FB. The command decoder 93 activates the accepting circuit 94b in response to activation of the accepting controlling signal ACON2 and outputs decoded results to a predetermined circuit as the activating signal ACT2. At this time the accepting circuit 94a is in activated. In other words, the chip select signal /CS, the function signal FN, and the row address signal A0 corresponding to the next command are decoded by the decoding circuit 95b. The accepting circuits 94a, 94b accept respective signals in synchronization with the pulse edges of the internal clock signal CLKIN at different timings.

In this embodiment, the accepting circuits 93a, 93b and decoding circuits 93c, 93d are separately configured according to the activating signals ACT1, ACT2. This makes it possible to readily design the command controlling circuit even in the semiconductor memory devices having complicated command combinations. Consequently, it is also possible to facilitate the verification of circuit design.

Owing to the direct acceptance of signals in synchronization with the same clock signal, the accepting procedures speed up. As a result, it is possible to initiate an operation of the internal circuit early and shorten the access time.

Switching over commands is not directly controlled by the clock signal but is carried out by the accepting part close to the controlling circuit performing a memory operation inside of the chip. This results in readily switching over commands even in the semiconductor memory devices operating in a high frequency.

In addition, the internal clock signal CLKIN which is a common trigger signal of the accepting circuits 94a, 94b is directly supplied through the clock buffer 29 from the exterior. Since the clock buffer 29 is not under control of any other controlling signals, a delay of the internal clock signal CLKIN relative to the clock signal CLK becomes minimized. As a result, it is possible to speed up the accepting procedures of the accepting circuits 94a, 94b and initiate the operations of the command decoder 93 and internal circuit. Thus the access time can be shortened.

Figure 15:
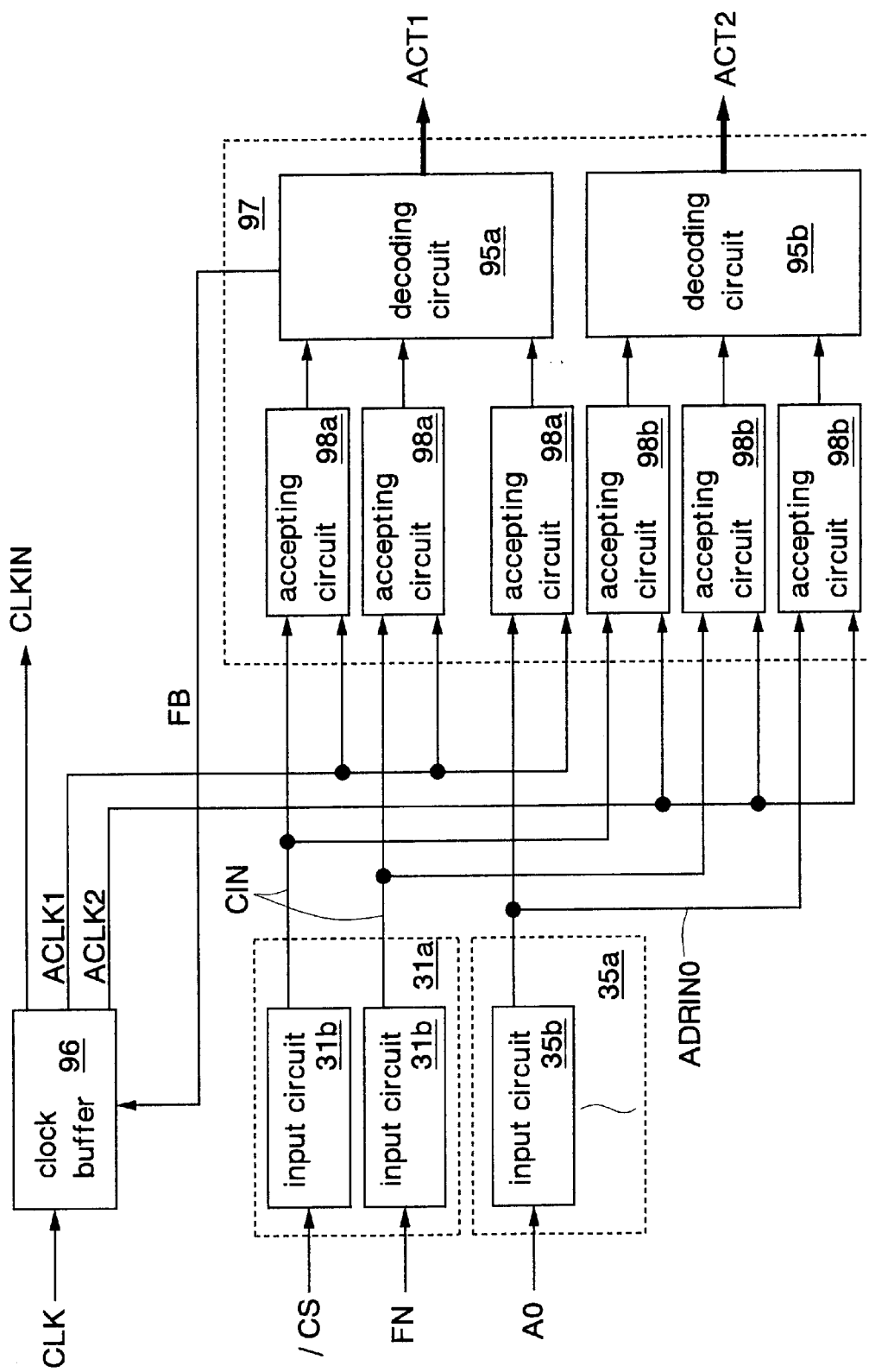
FIG. 15 is a block diagram showing the third embodiment of the semiconductor memory device according to the present invention.

FIG. 15 shows the details of a decoding unit in the semiconductor memory device of the third embodiment according to the present invention. The circuits same as those of the first and second embodiments will be indicated by identical reference numbers and the description thereof will be omitted here.

This embodiment is different from the second embodiment in a clock buffer 96 and a command decoder 97. The remaining part of this embodiment is the same as in the second embodiment.

The clock buffer 96 receives the clock signal CLK from the exterior, then outputs the received clock signal CLK as the accepting signal ACLK1 upon activation of the feedback signal FB, and outputs an accepting signal ACLK2 upon inactivation of the feedback signal FB. The accepting signal ACLK1 is not outputted upon inactivation of the feedback signal FB. Similarly the accepting signal ACLK2 is not outputted upon activation of the feedback signal FB.

The command decoder 97 includes three accepting circuits 98a each receiving the accepting signal ACLK1 and the decoding circuit 95a, and also three accepting circuits 98b each receiving the accepting signal ACLK2 corresponding to activating signals ACT2 and the decoding circuit 95b. The accepting circuits 98a and the decoding circuit 95a are formed corresponding to the activating signals ACT1. The accepting circuits 98b and the decoding circuit 95b are formed corresponding to the activating signals ACT2. Each accepting circuit 98a accepts either the internal signal CIN or the internal row address signal ADRIN0 in synchronization with the accepting signal ACLK1 and then output the accepted signal to the decoding circuit 95a. Each accepting circuit 98b accepts either the internal signal CIN or the internal row address signal ADRIN0 in synchronization with the accepting signal ACLK2 and then outputs the accepted signal to the decoding circuit 95b. The decoding circuits 95a, 95b are the same as those used in the second embodiment.

In this embodiment the accepting circuits 98a, 98b corresponding to the activating signals ACT1, ACT2 accept the signals in synchronization with respective different accepting signals ACLK1, ACLK2. Respective accepting signals ACLK1, ACLK2 are supplied only to the accepting circuits 98a, 98b for accepting respective signals, which serves to minimize the load (parasitic capacitance) of wirings of the signals.

More specifically, in cases where many accepting circuits 98a, 98b are used in this embodiment, it is possible to reduce the load (parasitic capacitance) of each clock signal wiring by using a plurality of clock signals for accepting signals. This is effective especially in cases where a large number of command input terminals are used.

An explanation will next be given of the second embodiment of the method for operating a semiconductor memory device of the present invention and the fourth embodiment of the semiconductor memory device of the present invention. The circuits and signals as those of the above-noted embodiments will be indicated by identical reference numbers and the detailed description thereof will be omitted here.

The semiconductor memory device of this embodiment is formed as an FCRAM with its internal circuit subdivided into three stages, which functions to let each of them perform a pipeline operation. The state transition diagram of this FCRAM is the same as FIG. 3. More specifically, the FCRAM shifts to an activating state R when receiving an RDA command as the first command; it shifts to an activating state W when receiving a WRA command as the first command. When receiving an LAL command and a MRS command as the second command in the activating state R, the FCRAM enters a read operation mode and a mode register setting mode, respectively. When receiving the LAL command and a REF command as the second command in the activating state W, the FCRAM enters a write operation mode and an auto refresh mode, respectively.

Figure 16:
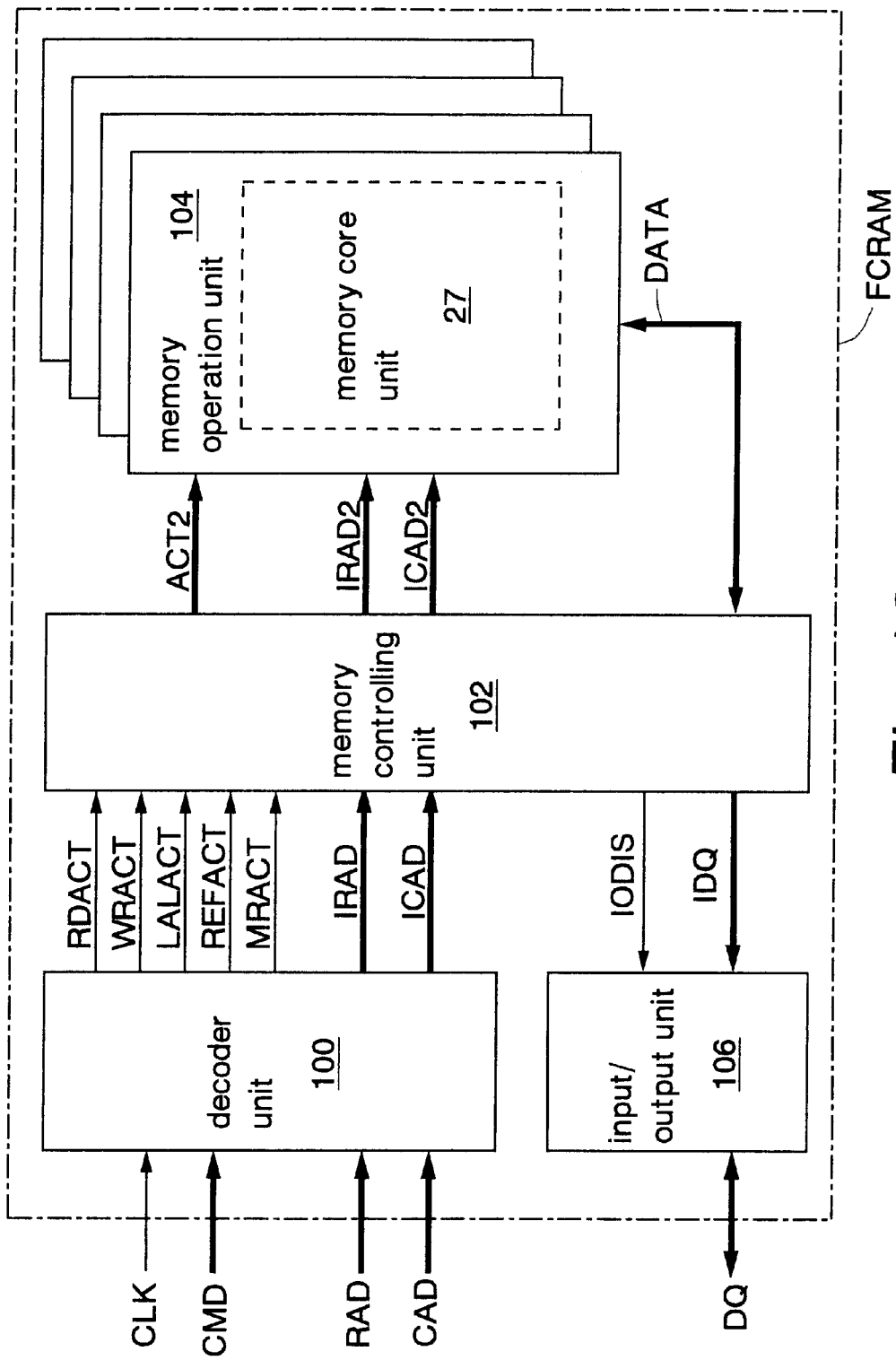
FIG. 16 is a diagram of the whole configuration of a chip in the second embodiment of the method for operating a semiconductor memory device and also in the fourth embodiment of the semiconductor device according to the present invention.

FIG. 16 shows the whole configuration of the FCRAM to which the present invention is applied.

The FCRAM includes a decoder unit 100, a memory controlling unit 102, four memory operation units 104, and an input/output unit 106. The memory operation units 104 are generally called "banks," each of which has its memory core unit 27 being the same as that in the first embodiment. The thick arrows in the drawing denote a plurality of signal lines.

The decoder unit 100 receives a clock signal CLK, command signals CMD, row address signals RAD, and column address signals CAD, and then outputs toward the memory controlling unit 102 activating signals RDACT, WRACT, LALACT, REFACT, MRACT as well as internal row address signals IRAD and internal column address signals ICAD, which correspond to the RDA command, the WRA command, the LAL command, the REF command and a MRS command, respectively. The memory controlling unit 102 receives signals from the decoder unit 100 and outputs to the memory operation units 104 activating signals ACT2, internal row address signals IRAD2, and internal column address signals ICAD2. In addition, the memory controlling unit 102 outputs an output disable signal IODIS to the input/output unit 106. The input/output unit 106 inputs and outputs data input/output signals DQ to and from the exterior of the device while inputting and outputting data signals DATA to and from the memory operation units 104.

Figure 17:
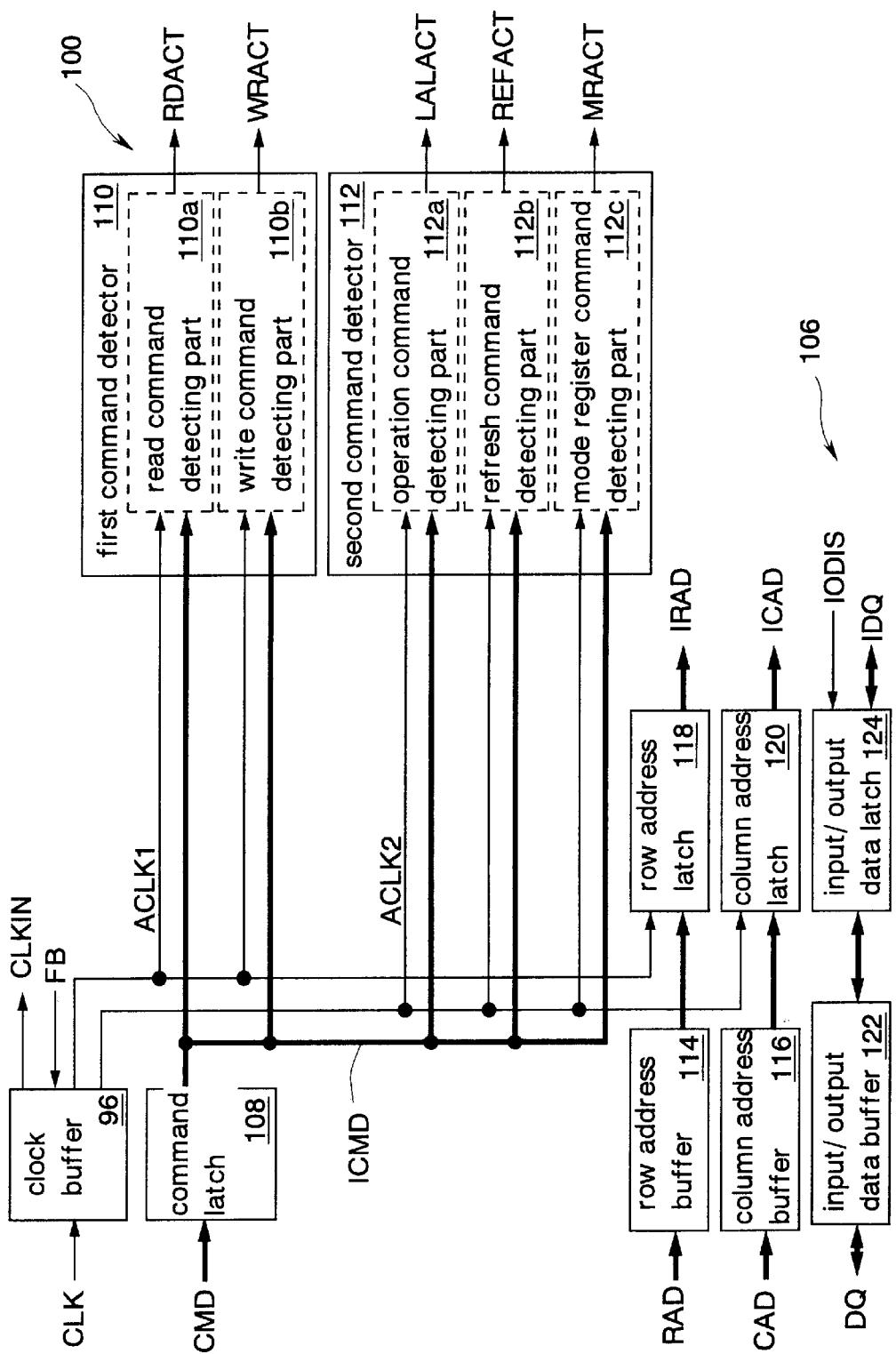
FIG. 17 is a block diagram showing the details of a decoder and an input/output unit of FIG. 16.

FIG. 17 shows the details of the decoder unit 100 and the input/output unit 106.

The decoder unit 100 comprises a clock buffer 96, a command latch 108, the first command detector 110, the second command detector 112, a row address buffer 114, a column address buffer 116, a row address latch 118, and a column address latch 120. The input/output unit 106 includes an input/output buffer 122 and an input/output data latch 124.

The clock buffer 96 is the same circuit as that of FIG. 15. The clock buffer 96 is controlled by a feedback signal FB, and outputs an accepting signal ACLK1 upon inputting of the first command while outputting an accepting signal ACLK2 upon inputting of the second command. The command latch 108 receives command signals CMD and then outputs the received signals as internal command signals ICMD.

The first command detector 110 includes a read command detecting part 110a and a write command detecting part 110b. The read command detecting part 110a accepts the internal command signal ICMD in synchronization with the accepting signal ACLK1, and activates the activating signal RDACT when the accepted signal is the RDA command. The write command detecting part 110b accepts the internal command signal ICMD in synchronization with the accepting signal ACLK1, and activates the activating signal WRACT when the accepted signal is the WDA command.

The second command detector 112 includes an operation command detecting part 112a, a refresh command detecting part 112b, and a mode register command detecting part 112c. The operation command detecting part 112a accepts internal command signals ICMD in synchronization with the accepting signal ACLK2 and activates the activating signal LALACT when the accepted signal is the LAL command. The refresh command detecting part 112b accepts the internal command signals ICMD in synchronization with the accepting signal ACLK2 and activates the activating signal REFACT when the accepted signal is the REF command. The mode register detecting part 112c accepts the internal command signals ICMD in synchronization with the accepting signal ACLK2 and activates the activating signal MRACT when the accepted signal is the MRS command.

The row address buffer 114 receives row address signals RAD and outputs the received signals to the row address latch 118. The row address latch 118 accepts the address signals in synchronization with the accepting signal ACLK1 and outputs the accepted signals as the internal row address signals IRAD. The column address latch 116 receives column address signals CAD and outputs the received signals to the column address latch 120. The column address latch 120 accepts the address signals in synchronization with the accepting signal ACLK2 and outputs the accepted signals as the internal row address signals ICAD.

The input/output buffer 122 inputs and outputs a data input/output signals DQ to and from the exterior of the device while at the same time inputting and outputting these signals with respect to the input/output data latch 124. The input/output data latch 124 functions to convert serial data supplied from the input/output buffer 122 into parallel data and also to convert parallel data signals DATA supplied from the memory operation units 104 to serial data. The input/output data latch 124 is such that when receiving an output disable signal IODIS, the data latch terminates outputting of data signals toward the input/output buffer 122.

Figure 18:
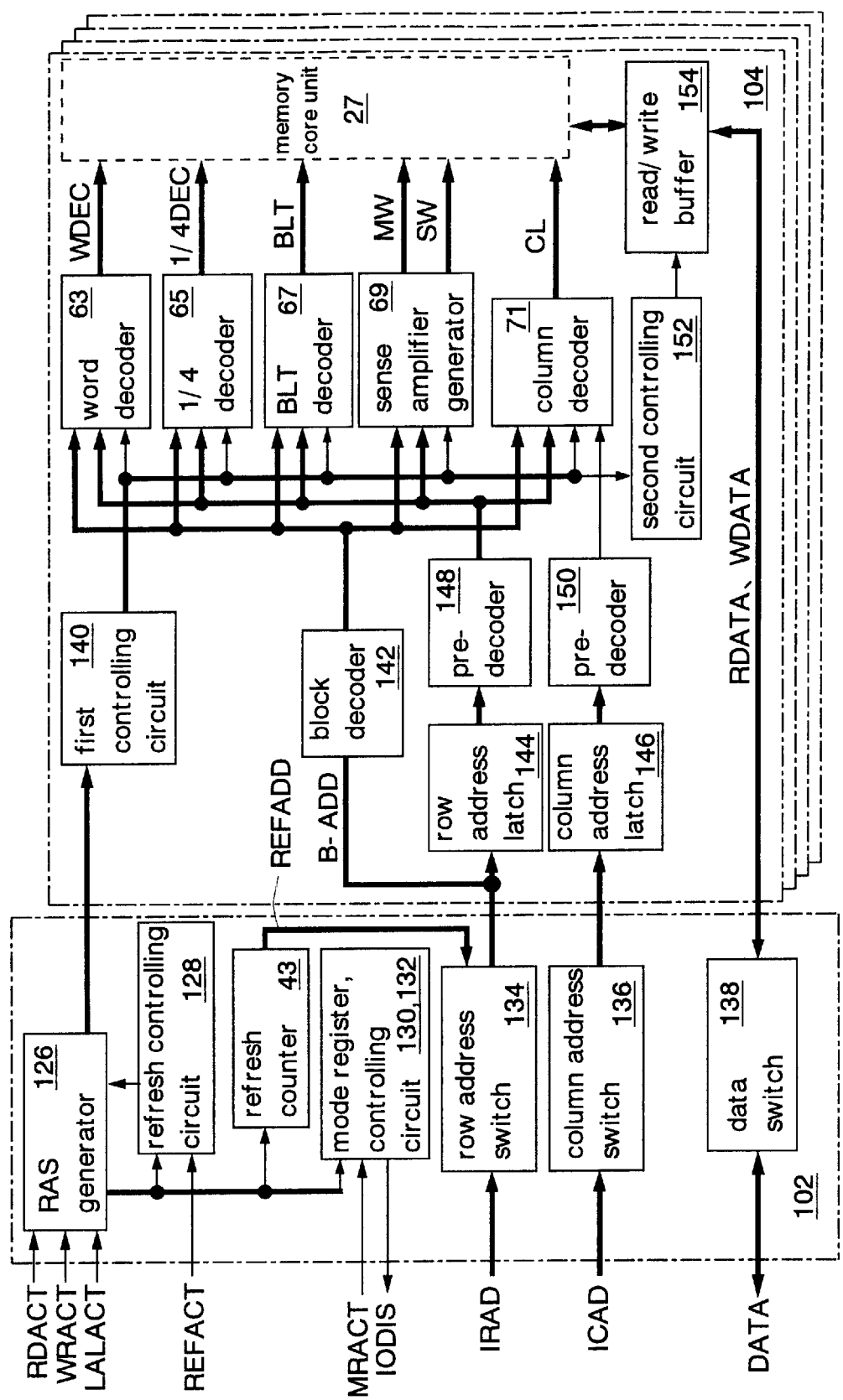
FIG. 18 is a block diagram showing the details of a memory controlling unit and a memory operation unit of FIG. 16.

FIG. 18 shows the details of the memory controlling unit 102 and the memory operation units 104.

The memory controlling unit 102 includes a RAS generator 126, a refresh controlling circuit 128, a refresh counter 43, a mode register 130 and its associated controlling circuit 132, a row address switch 134, a column address switch 136, and a data switch 138. The memory operation units 104 each include the first controlling circuit 140, a block decoder 142, a row address latch 144, a column address latch 146, predecoders 148, 150, the second controlling circuit 152, a read/write buffer 154, word decoder 63, a ¼ decoder 65, a BLT decoder 67, a sense amplifier generator 69, a column decoder 71, and a memory core unit 27.

The RAS generator 126 receives activating signals RDACT, WRACT, LALACT, and outputs controlling signals to the refresh controlling circuit 128, the refresh counter 43, the mode register 130, the controlling circuit 132, and the first controlling circuit 140 to be described later, respectively. The RAS generator 126 is the same in function as the RAS generator 53 shown in FIG. 7.

The refresh controlling circuit 128 receives the controlling signal from the RAS generator 126 along with the activating signal REFACT, and outputs a controlling signal to the RAS generator 126. In other words, there fresh controlling circuit 128 controls the RAS generator 126 when the activating signal REFACT is activated (in an auto refresh mode).

The refresh counter 43 counts up upon receipt of the controlling signal from the RAS generator 126, and outputs refresh addresses REFADD that is the value of such counter.

The mode register 130 and the controlling circuit 132 receive a controlling signal from the RAS generator 126 along with the activating signal MRACT, and output an output disable signal IODIS when the activating signal MRACT is being activated. The mode register 130 is connected to a data signal line that is not shown in the drawing; the mode register 130 is set up by a data signal supplied through the data signal line.

The row address switch 134 outputs to the row address latch 144 the internal row address signals IRAD and the refresh addresses REFADD. The column address switch 136 receives the internal row address signals ICAD and outputs the received signals to the column address latch 146. Additionally, owing to a switch operation of the row address switch 134 and column address switch 136, the address signals will be supplied to any one of the four separate memory operation units 104.

The data switch 138 is a circuit that operates to input and output data signals (DATA) to and from any one of the four memory operation units 104.

The first controlling circuit 140 receives the controlling signals from the RAS generator 126 and controls the word decoder 63 and the like. The first controlling circuit 140 is the same in function as the first controlling circuit 57 shown in FIG. 7.

The row address latch 144 and column address latch 146 are the circuit that latches address signals with respect to each of the memory operation units 104.

The block decoder 142, the predecoders 148, 150, the second controlling circuit 152, and the read/write buffer 154 are the same in function as the block decoder 61, the predecoders 59a, 59b, the second controlling circuit 73, and the read/write buffer 75 shown in FIG. 7. The word decoder 63, the ¼ decoder 65, the BLT decoder 67, the sense amplifier generator 69, the column decoder 71 and the memory core unit 27 are the same as those of FIG. 7.

Figure 19:
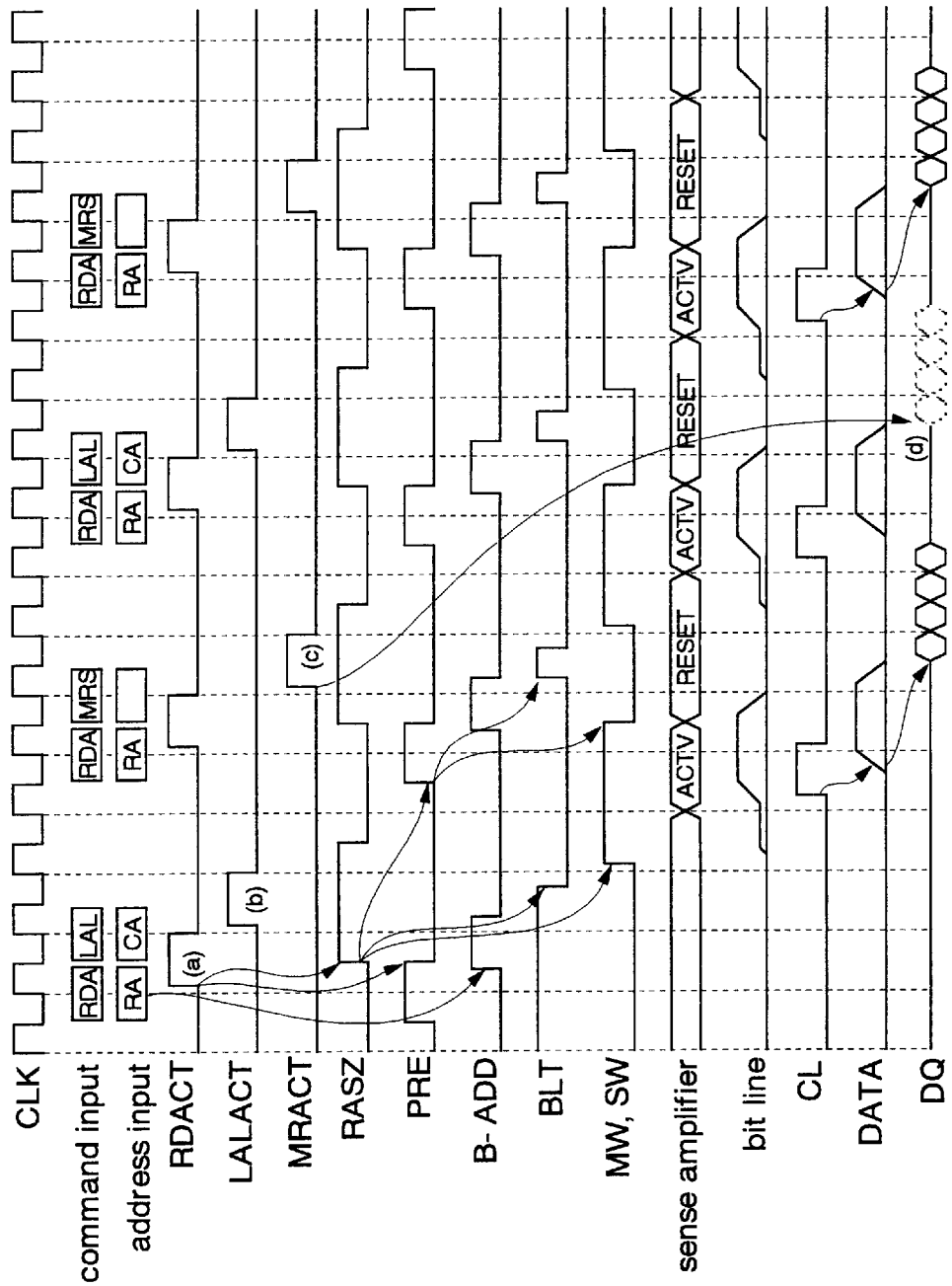
FIG. 19 is a timing chart showing read operations of the semiconductor memory device of FIG. 16.

FIG. 19 shows the timings of some major signals during read operations. Note that an explanation on the same operation as that of FIG. 11 will be omitted. In this example, read operations and mode register setting operations will be performed alternately.

Firstly, the command latch 108 of FIG. 17 accepts the RDA command as the first command. The row address signals RAD are then accepted in synchronization with the acceptance of the first command. The RDA command is supplied as internal command signals ICMD to the first command detector 110 and the second command detector 112. Here, upon accepting of the first command, the accepting signal ACLK1 is output while preventing the output of the accepting signal ACLK2. This ensures that the second command detector 112 does not accept the internal command signals ICMD.

The read command detecting part 110a and write command detecting part 110b of the first command detector 110 accept the internal command signals ICMD (RDA command) in synchronization with the accepting signal ACLK1. The read command detecting part 110a detects that the RDA command has been supplied, thereby activating the activating signal RDACT (FIG. 19(a)). As the write command detecting part 110a is incapable of detecting the supplement of the WDA command, it retains the inactivating state of the activating signal WRACT. Thereafter, the memory controlling unit 102 and the memory operation units 104 receive the activating signal RDACT and then operate in the same way as in FIG. 11. More specifically, upon supplying the first command, the word line select signal RASZ is activated whereas the precharge controlling signal PRE is inactivated.

Next, the command latch 108 accepts the LAL command as the second command. The column address signals CAD are accepted in synchronization with the acceptance of the first command. The LAL command is then supplied as the internal command signals ICMD to the first command detector 110 and second command detector 112. Here, upon accepting of the second command, the accepting signal ACLK2 is output while preventing the accepting signal ACLK1 from being output. Due to this, the first command detector 110 no longer accepts the internal commands ICMD.

The operation command detecting part 112a, the refresh command detecting part 112b and the mode register command detecting part 112c of the second command detector 112 accept the internal command signals ICMD (LAL command) in synchronization with the accepting signal ACLK2. The operation command detecting part 112a detects that the LAL command has been supplied, and then activates the activating signal LALACT (FIG. 19(b)). As the refresh command detecting part 112b and the mode register command detecting part 112c are incapable of detecting the supplement of the REF command and the MRS command, these units retain the inactivating states of the activating signals REFACT, MRACT. Thereafter, the memory controlling unit 102 and the memory operation units 104 operate in the same way as in FIG. 11 whereby a read operation is performed.

Further, the command latch 108 accepts the RDA command as the first command at the fourth clock as counted from the accepting event of the initial first command. An operation to be done after having accepted the first command is the same as described above.

Next, the command latch 108 accepts the MRS command as the second command. The mode register command detecting part 112c of the second command detector 112 accepts the internal command signals ICMD (MRS command) in synchronization with the accepting signal ACLK2 and then activates the activating signal MRACT (FIG. 19(c)). The controlling circuit 132 of FIG. 18 receives the activating signal MRACT and then inactivates the output disable signal IODIS (its waveform is not shown in the drawing). The input/output data latch 124 of FIG. 17 receives the output disable signal IODIS and is then made inactive. As a result of this, it is inhibited that any data signal is output to the exterior in the mode register setting mode (FIG. 19(d)). Thereafter, each bit of the mode register will be set through data lines, not shown in the drawing.

Figure 20:
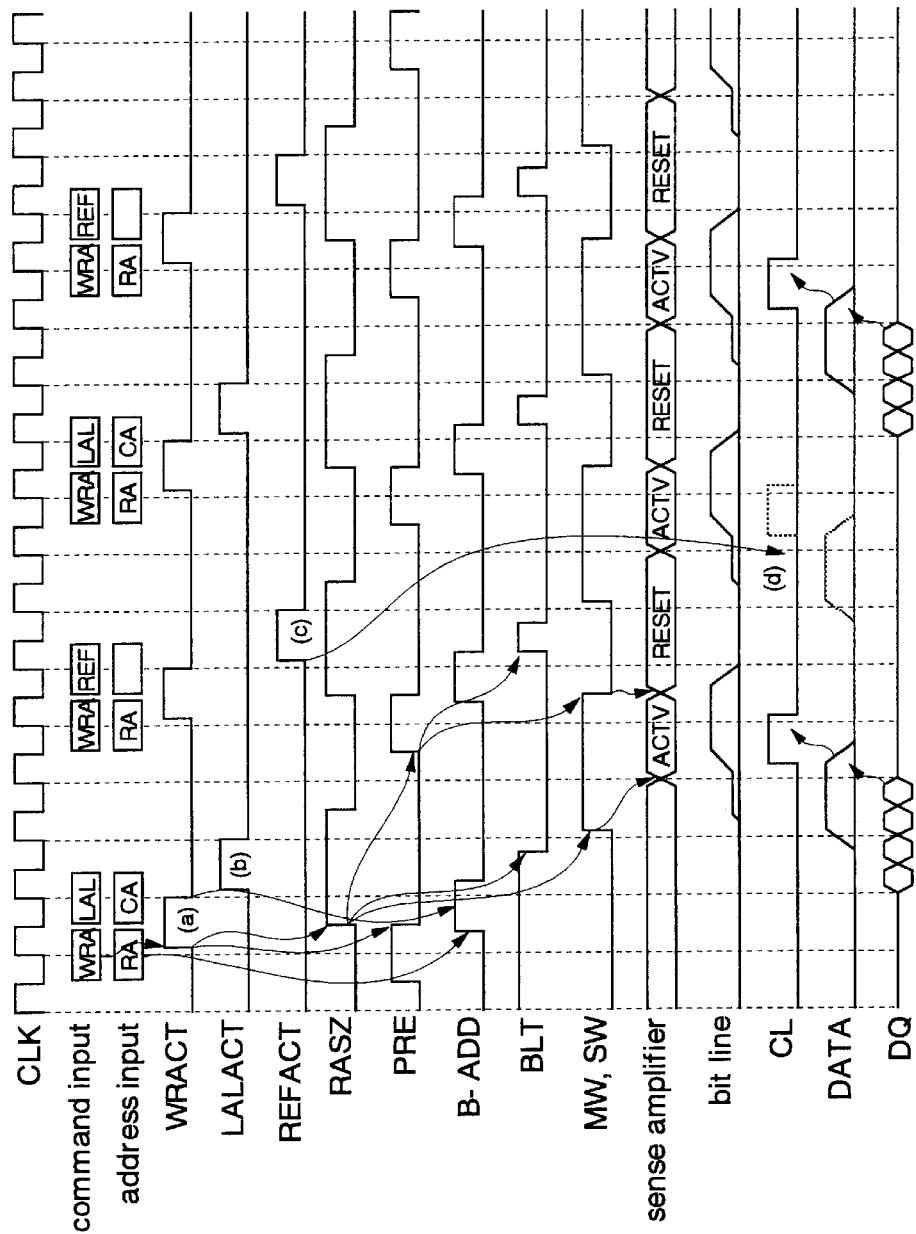
FIG. 20 is a timing chart showing write operations of the semiconductor memory device of FIG. 16.

FIG. 20 shows the timings of some major signals during a write operation. Note that an explanation on the same operation as that of FIG. 19 will be omitted. In this example, a write operation and an auto refresh operation will be performed alternately.

First, the command latch 108 of FIG. 17 accepts the WRA command as the first command. The row address signals RAD are then accepted in synchronization with such accepting of the first command. The write command detecting part 110b of the first command detector 110 accepts the internal command signals ICMD (WRA command) in synchronization with the accepting signal ACLK1, and then activates the activating signal WRACT (FIG. 20(a)).

Next, the, command latch 108 accepts the LAL command as the second command. The operation command detecting part 112a of the second command detector 112 accepts the internal command signals ICMD (LAL command) in synchronization with the accepting signal ACLK2 and activates the activating signal LALACT (FIG. 20(b)). In addition, write signals are accepted in synchronization with the rising edge of a clock signal CLK as accepted by the second command and also with its proceeding edge of the clock signal. And the memory controlling unit 102 and the memory operation units 104 are operated to perform a write operation.

Furthermore, the command latch 108 accepts the WRA command as the first command at the fourth clock as counted from the acceptance of the initial first command. An operation to be performed after having accepted the first command is the same as the operation stated above. Next, the command latch 108 accepts the REF command as the second commend. The refresh command detecting part 112b of the second command detector 112 accepts the internal command signals ICMD (REF command) in synchronization with the accepting signal ACLK2, and activates the activating signal REFACT (FIG. 20(c)). Activating the activating signal REFACT results in execution of an auto refresh operation. Additionally, the activation of the column selecting signal CL is prevented in response to the activation of the activating signal REFACT, thus inhibiting writing of any invalid data.

In this embodiment, the same effects as those in the first embodiment are obtainable. In particular, the present invention is such that remarkable effects may be obtained by applying to an FCRAM with its internal circuit subdivided into a plurality of stages for permitting each stage to perform pipeline processing to thereby perform read and write operations.

Figure 21:
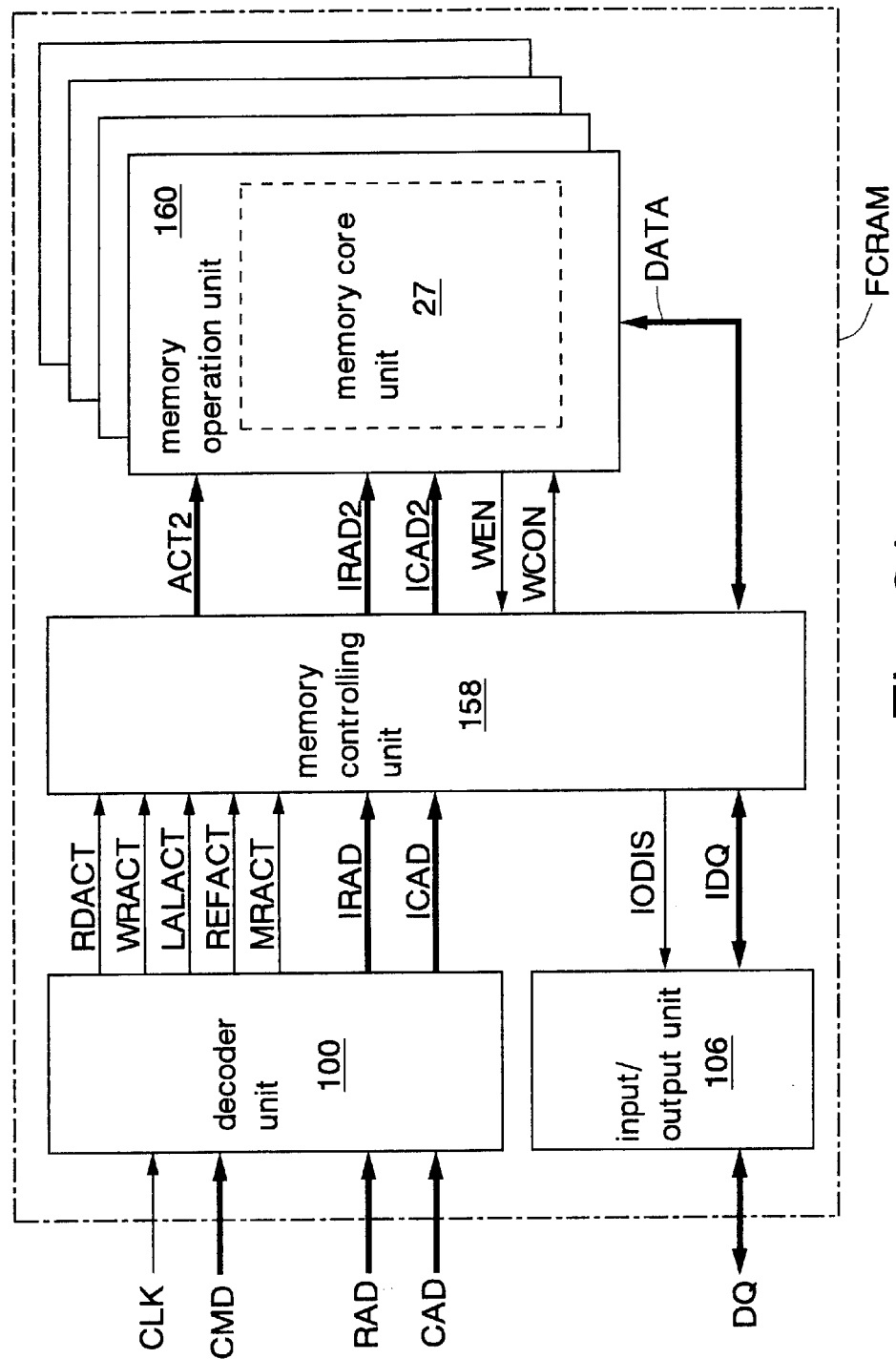
FIG. 21 is a diagram of the whole configuration of a chip in the third embodiment of the method for operating a semiconductor memory device and also in the fifth embodiment of the semiconductor device according to the present invention.

FIG. 21 shows the third embodiment of the method for operating a semiconductor memory device operation control method and the fifth embodiment of the semiconductor memory device according to the present invention. The circuits and signals same as those of the above-noted embodiments will be indicated by identical reference numbers and the detailed explanation thereof will be omitted here.

In this embodiment, a memory controlling unit 158 and memory operation units 160 are different from those of FIG. 16. The remaining parts are the same as those in FIG. 16. In addition, the FCRAM of this embodiment has a specific function, called "delay write" or "late write," of writing into a memory cell write data supplied corresponding to a write command at a time of supplying the next write command, in order to improve the usage efficiencies of data bus.

Figure 22:
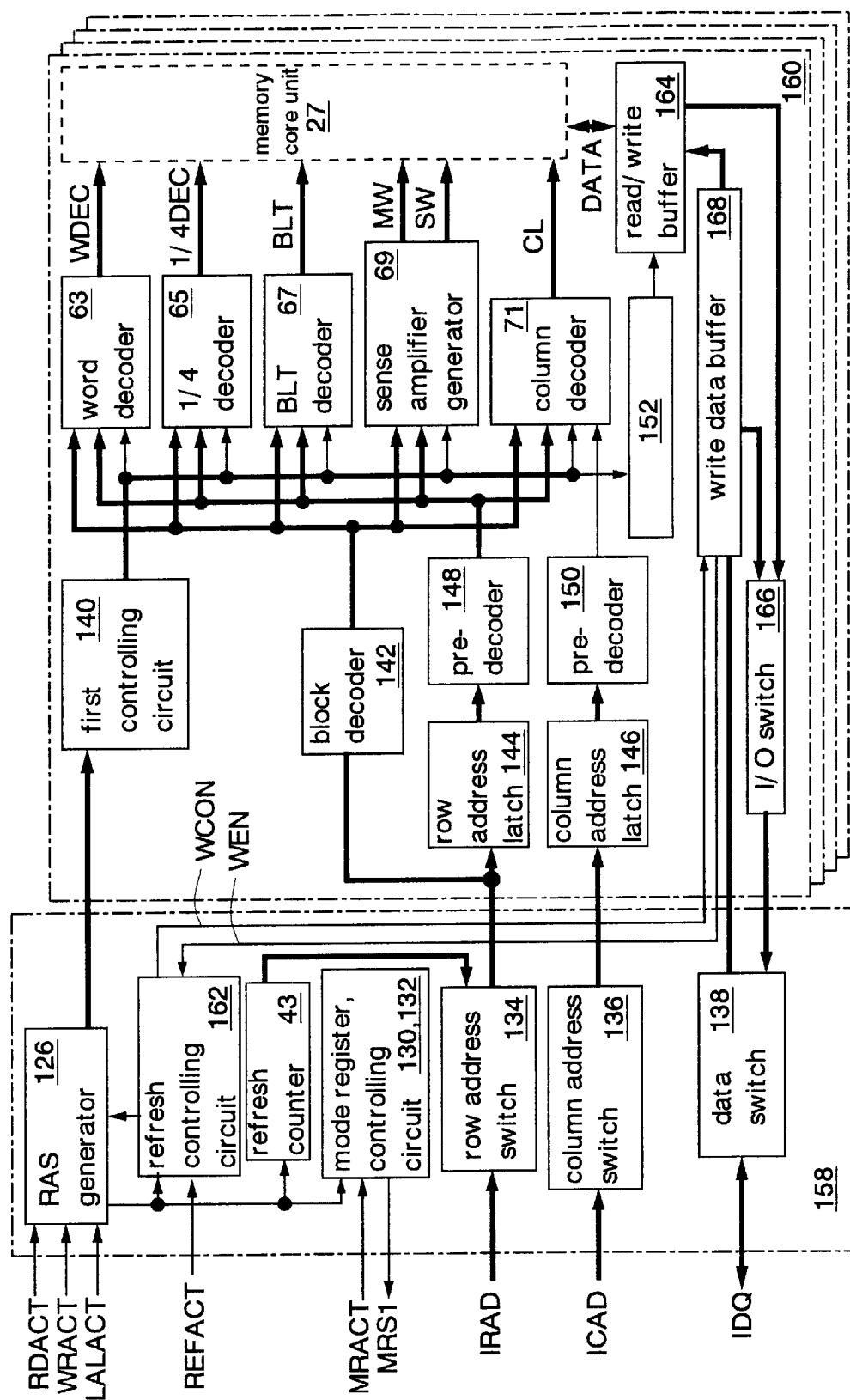
FIG. 22 is a block diagram showing the details of a memory controlling unit and a memory operation unit of FIG. 16.

FIG. 22 shows the details of the memory controlling unit 158 and memory operation units 160.

The memory controlling unit 158 comprises a refresh controlling circuit 162 different from that of FIG. 18. The memory operation units 160 includes a read/write buffer 164 different from that in FIG. 18. In addition, the memory operation units 160 newly include an I/O switch 166 and a write data buffer 168. Note here that although not specifically depicted in the drawing, the memory operation units 160 have a write address buffer for holding a write address.

The refresh controlling circuit 162 receives a controlling signal from the RAS generator 126 and the activating signal REFACT along with a write data enable signal WEN from the write data buffer 168, and outputs a controlling signal to the RAS generator 126 while outputting a write controlling signal WCON to the write data buffer 168.

The write data enable signal WEN is a signal that permits, when there has valid write data in the write data buffer 168, transmission of the information (high level) to the refresh controlling circuit 162. As will be described later, the refresh controlling circuit 162 does not perform any refresh operation when receiving the refresh command REF during a period in which the write data enable signal WEN is set at high level. The refresh controlling circuit 162 performs a refresh operation only when receiving the refresh command REF during a period in which the write data enable signal WEN is set at low level.

The write controlling signal WCON is a signal that is output upon receipt of the refresh command REF. As will be described later, the write data buffer 168 is such that in the state that valid write data exists, the buffer outputs the data to the read/write buffer 164 only when receiving the write controlling signal WCON. Then a write operation is performed.

The I/O switch 166 is a circuit for transmitting during a read operation either one of the data being read out of the memory core unit 27 and the data stored in the write data buffer 168 toward the data switch 138. More specifically, in the event that write data and write address are stored due to a write operation into the write data buffer 168 and the write address buffer (not shown) and a read operation is then performed relative to the same address immediately after completion of the data/address writing, the write data stored in the write data buffer 168 is output to the exterior as read data through the I/O switch 166 and the data switch 138.

Figure 23:
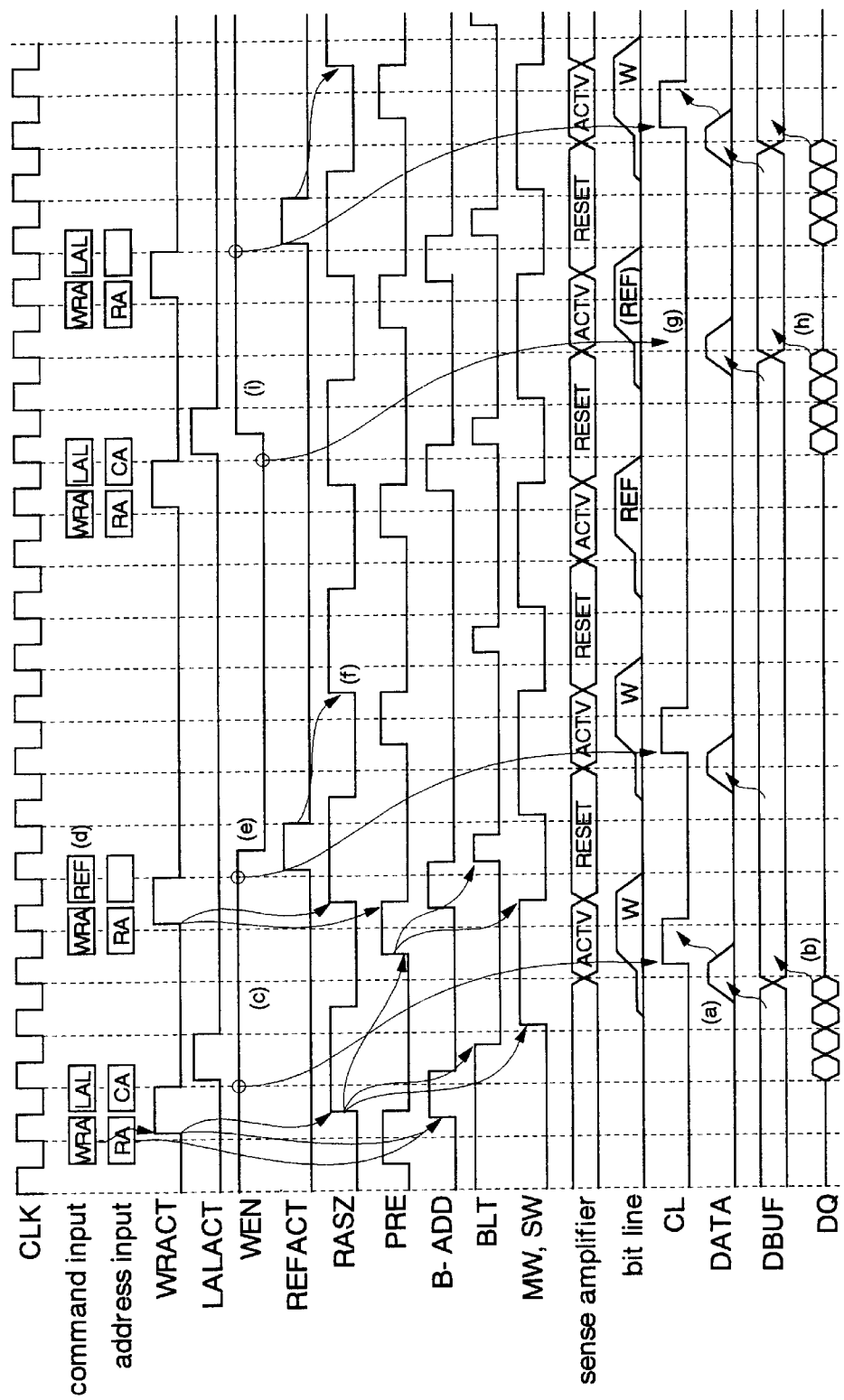
FIG. 23 is a timing chart showing read operations of the semiconductor memory device of FIG. 21.

FIG. 23 shows the timings of some major signals during a write operation. Note that an explanation on the same operation as that of FIG. 20 will be omitted. In this example, a write operation is continuously performed after having executed write operations and an auto refresh operation.

In the initial write operation, the valid write data DBUF as stored in the write data buffer 168 is written into the memory core unit 27 (FIG. 23(a)). In addition, the write data buffer 168 accepts a newly supplied write data input/output signals DQ (FIG. 23(b)). As the refresh controlling circuit 162 retains the valid write data DBUF, it outputs the write data enable signal WEN at high level (FIG. 23(c)).

Next, the WRA command and the REF command are supplied (FIG. 23(d)). The refresh controlling circuit 162 receives the activating signal REFACT along with the write data enable signal WE at high level, and then outputs the write controlling signal WCON (waveform is not shown in the drawing). The write data buffer 168 receives the write controlling signal WCON and outputs its retaining data DBUF toward the read/write buffer 164. Specifically, in case the valid data DBUF exists in the write data buffer 168, the FCRAM first performs a write operation when receiving the REF command.

In addition, the write data buffer 168 changes the level of the write data enable signal WEN to low level (FIG. 23(*e*)). Thereafter, RASZ signal is activated upon receiving of the activating signal REFACT, resulting in executing of the refresh operation (FIG. 23(*f*)). In the drawing the reference character "W" added to bit lines designates a write operation whereas "REF" denotes a refresh operation. Additionally "(REF)" indicates that a word line is selected due to activation of the word line selecting signal RASZ and then a refresh operation is performed automatically.

Next, the WRA command and the LAL command are supplied. At this time, the write data buffer 168 does not store any valid write data therein (write data enable signal WEN=low level) so that a write operation in the, memory core unit 27 is never performed. Thus, the column line selecting signal CL is kept at low level (FIG. 23(*g*)). Additionally the write data buffer 168 accepts write data input/output signals DQ supplied from the exterior (FIG. 23(*h*)), and then outputs the WEN signal at high level (FIG. 23(*i*)).

Furthermore, the WRA command and the LAL command are supplied and then a write operation is performed.

Figure 24:
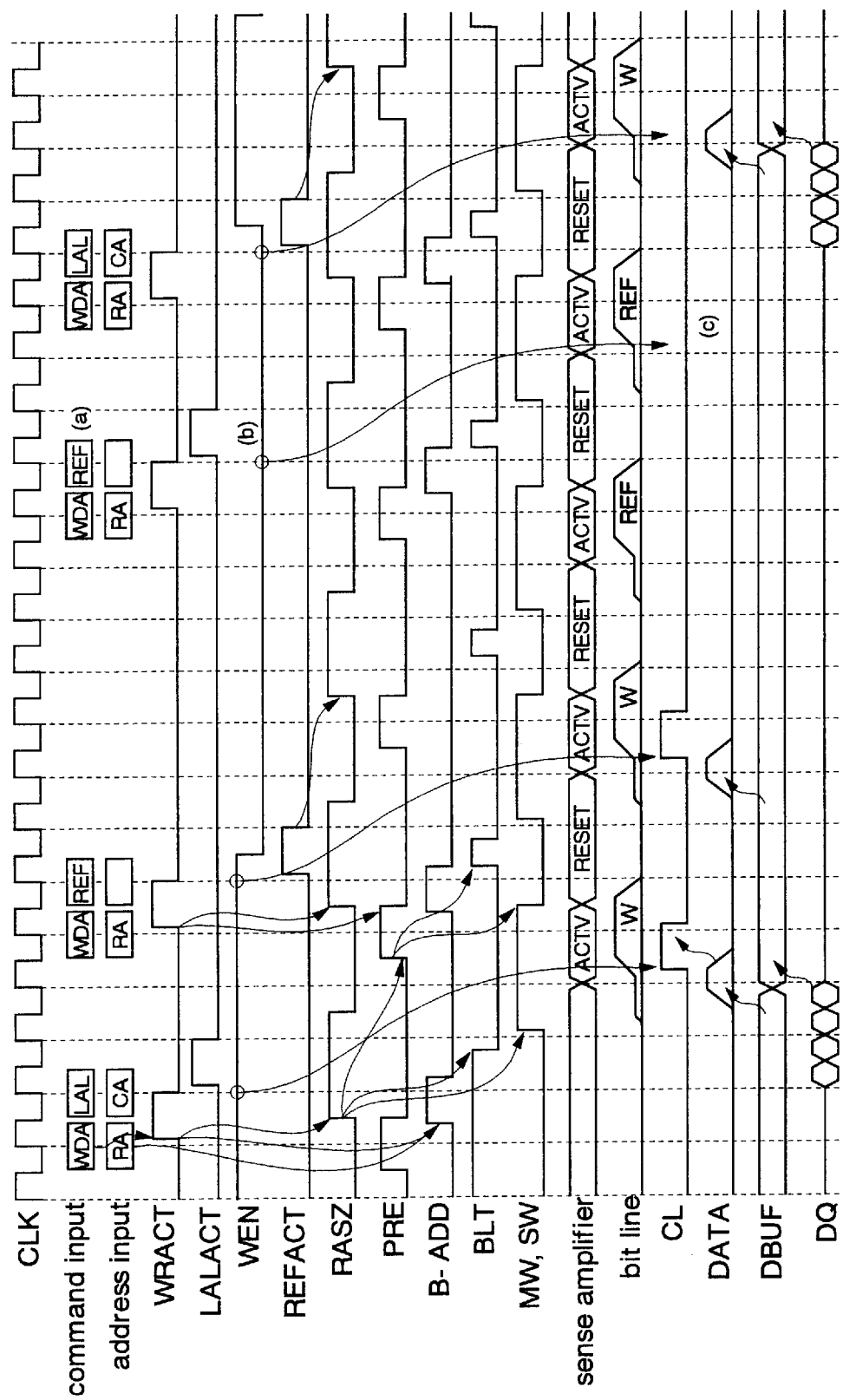
FIG. 24 is a timing chart showing write operations of the semiconductor memory device of FIG. 21.

FIG. 24 shows another example of the timings of major signals during a write operation. Note that an explanation on the same operation as that of FIG. 23 will be omitted. In this example, the auto refresh operation is performed twice in succession after completion of a write operation; thereafter, a write operation is further performed. The initial write operation and the initial refresh operation are the same as those in FIG. 23.

Next, the WRA command and the REF command are supplied (FIG. 24(*a*)). At this time, the write data buffer 168 does not retain any valid data therein so that it outputs a write data enable signal WEN at low level (FIG. 24(*b*)). Due to this, the refresh controlling circuit 162 receives the activating signal REFACT and the write data enable signal WEN at low level, thus performing a refresh operation. In addition the refresh controlling circuit 162 inactivates the write controlling signal WCON during the previous refresh operation (the waveform is not shown in the drawing). As a result, the write data buffer 168 receives the inactivated write controlling signal WCON so that invalid write data DBUF stored in the write data buffer 168 is not output (FIG. 24(*c*)).

Thereafter, the WRA command and the LAL command are supplied and a write operation is performed.

In this embodiment, the same effects as those in the embodiments stated above may be obtained. Further, in this embodiment, the present invention may also be easily applied to FCRAMs with a delay-write function.

Furthermore, in case there has valid data in the write data buffer 168 when the operation mode determined by the input of the second command is an auto refresh mode, first a write operation and then a refresh operation are performed. Thus, utilizing the circuit whose operation is initiated by the input of the first command enables the efficient write operation.

It should be noted that in the above embodiment, one specific example has been described that the write data length controlling circuit 85, which controls the data converter 79 for write data, is provided for controlling the length of write data. However, the present invention should not be limited only to such embodiment.

For instance, a read data length controlling circuit, which controls the data converter 77 for the read operation, may be provided for controlling the length of read data. In this case, when the operating mode as determined upon inputting the second command is a read operation mode, a signal supplied to a predetermined terminal is accepted as the information for specifying the length of read data. And the read data length control is performed directly based on such information accepted. Accordingly, it is possible, when outputting a plurality of data in succession, to change the length of outputting data without performing any complicated control procedures. Additionally, with regard to the data unnecessary to be read (a part longer than the specified data length), any output control need not be performed so that the time taken for controlling read operation may be saved. The input of the first command can be festinated in the next cycle.

In addition, it is possible to perform the control of accepting a signal supplied to a predetermined terminal as masking information, which invalidates a part of the write data supplied in succession, and masking a part of the write data based on the masking information accepted when the operating mode determined upon inputting the second command is the write operation mode. In order to control the masking information by a dedicated terminal, the information must be accepted from such dedicated terminal once at a time in accordance with the write operation, resulting in complicating the control procedures. Such mask control procedures may be made easier by accepting the masking information upon inputting the second command.

Read data mask control may be performed in a way similar to that of the write data mask control.

It should also be noted that the embodiments above have been discussed under an assumption that the present invention is applied to DRAMs. However, this invention should not be limited to such embodiments. For example, the same effects may also be obtainable when applying the invention to other semiconductor memory devices such as static random access memories (SRAMs) and flash memories.

The invention is not limited to the above embodiments and various modifications may be made without departing from the spirit and the scope of the invention. Any improvement may be made in part of all of the components.

What is claimed is:

1. A method for operating a semiconductor memory device, having a plurality of operating modes, for fetching a series of commands and controlling an internal circuit, said method comprising the steps of:

initiating a first operation in response to a first command in said series of commands;

continuing with said first operation when a second command, following after said first command in said series of commands, requires the first operation;

terminating said first operation in response to the second command when the second command does not require at least the continuation of the first operation;

initiating a second operation by the second command when the second command, not requiring said continuation, requires the second operation.

2. A method according to claim 1 wherein said operating modes include a mode register setting mode for setting an operating of the device, said method further comprising the step of terminating said first operation and setting information in a mode register as said second operation when said operating mode determined by said second command is said mode register setting mode.

3. A method according to claim 2 wherein when said operating mode determined by said second command is said mode register setting mode, further comprising the step of accepting, in said second operation, a signal supplied to an address terminal as information for setting each bit of a mode register.

4. A method according to claim 1 further comprising the steps of:

inhibiting the acceptance of said first command in accordance with a signal supplied to a predetermined terminal and shifting to standby mode when the level of a signal supplied to a predetermined terminal reaches predetermined level during the inhibiting state.

5. A method according to claim 4 wherein said standby mode is a low power consumption mode which inactivates a predetermined input circuit.

6. A method according to claim 1 comprising the steps of:

accepting said each command in synchronization with a clock signal; and accepting said second command a half or one clock signal after the acceptance of said first command.

7. A method according to claim 1 wherein said operating modes include a write operation mode for writing data in memory cells and a read operation mode for reading data from memory cells, said method further comprising the steps of:

distinguishing said write operation mode from said read operation mode by said first command and starting an operation of a circuit common to both said write operation mode and said read operation mode, which is part of said first operation.

8. A method according to claim 7 further comprising the steps, in said first operation, of:

accepting a signal supplied to an address terminal with said first command as a part of the address necessary for either a write operation or a read operation and accepting a signal supplied to said address terminal as the remainder of said address necessary for either said write operation or said read operation when the operating mode determined by said second command is said write operation mode or said read operation mode.

9. A method according to claim 8 comprising the step of selecting, in said first operation, a word line corresponding to a part of said address accepted with said first command.

10. A method according to claim 9 wherein said operating modes include an auto refresh mode which generates a predetermined address and refreshes data in memory cells at the address and when said operating mode determined by said second command is said auto refresh mode, further comprising the steps of:

unselecting said word line corresponding to said address accepted with said first command, to terminate said first operation; and selecting, in said second operation, said word line corresponding to said predetermined address, which is internally generated.

11. A method according to claim 9 wherein said word line comprises a main-word line and sub-word lines which branch from the main-word line, said method further comprising the steps of:

specifying at least said sub-word lines by said address accepted together with said first command and selecting the sub-word lines.

12. A method according to claim 8 further comprising the steps of:

starting an activation of a column decoder by said first command selecting a column selecting line utilizing said address accepted with said second command.

13. A method according to claim 8 wherein the determined operating mode is said write operation mode, said method further comprising the steps of:

accepting a signal supplied to a predetermined terminal as information to specify the length of write data and controlling the data length based on said accepted information.

14. A method according to claim 8 wherein the determined operating mode is said write operation mode, further comprising the steps of:

accepting a signal being supplied to a predetermined terminal as masking information which invalidates a part of each of write data supplied in succession and masking the part of each of write data based on the accepted masking information.

15. A method according to claim 8 wherein said determined operating mode is said read operation mode, further comprising the steps of:

accepting a signal being supplied to a predetermined terminal as information to specify the length of read data and controlling the data length based on said accepted information.

16. A method according to claim 8 wherein said determined operating mode is said read operation mode, said method further comprising the steps of:

accepting a signal being supplied to a predetermined terminal as masking information which invalidates a part of each of the read data as being output in succession and masking the part of each of the read data based on the accepted mask information.

17. A method according to claim 8 wherein said address accepted at the preceding said write operation mode and write data are used to perform the write operation when the determined operating mode is said write operation mode.

18. A method according to claim 17, wherein said operation modes narrowed down by the first command include said write operation mode and a refresh operation is performed after the performance of said write operation when said operation mode determined at the time of inputting the second command is an auto refresh mode, which generates a predetermined address and refreshes data stored in memory cells.

19. A semiconductor memory device having a plurality of operating modes, for fetching a series of commands and controlling an internal circuit, comprising a controlling circuit being operable to:

initiate a first operation in response to a first command in said series of commands;

continue with said first operation when a second command, following after said first command in said series of commands, requires the first operation;

terminate said first operation in response to the second command when the second command does not require at least the continuation of the first operation;

initiate a second operation by the second command when the second command, not requiring said continuation, requires the second operation.

20. A semiconductor memory device according to claim 19 wherein said controlling circuit comprises a command controlling circuit which accepts signals supplied to predetermined terminals as said commands at a plurality of times, said command controlling circuit comprising a plurality of accepting circuits which respectively accept each of said signals supplied at a plurality of times.

21. A semiconductor memory device according to claim 20 wherein each of said accepting circuits respectively accepts said signal in synchronization with the different edges of a clock signal.

22. A semiconductor memory device according to claim 20 further comprising a timing generator for generating a plurality of accepting signals which have different triggering timings based on a clock signal, wherein each of said accepting circuits respectively accepts said each signal in synchronization with said each accepting signal.

23. A method according to claim 1, wherein said operating modes include a data retaining mode for retaining data in memory cells.

24. A method according to claim 23, wherein said operating mode determined by said second command is said data retaining mode, further comprising the step of shifting to a standby mode when a signal at a predetermined level, supplied to a predetermined terminal is received.

25. A method according to claim 24, wherein said data retaining mode is an auto refresh mode which generates a predetermined address and refreshes data in memory cells corresponding to said address, and said standby mode is a self refresh mode for sequentially generating predetermined addresses and sequentially refreshing data in memory cells corresponding to said addresses with time intervals in between each refreshing operation.

26. A method for operating a semiconductor memory device, having first and second operating modes, comprising the steps of:

receiving a first command or a second command; then receiving a third command;

selecting the first operation mode in response to a combination of the first and third commands; and selecting the second operation mode in response to a combination of the second and third commands.

* * * * *